United States Patent
Ueda et al.

(10) Patent No.: US 9,209,311 B2
(45) Date of Patent: Dec. 8, 2015

(54) THIN FILM TRANSISTOR AND METHOD FOR MANUFACTURING THE SAME

(75) Inventors: Tomomasa Ueda, Kanagawa-ken (JO); Shintaro Nakano, Kanagawa-ken (JP); Nobuyoshi Saito, Kanagawa-ken (JP); Yujiro Hara, Kanagawa-ken (JP); Shuichi Uchikoga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/410,892

(22) Filed: Mar. 2, 2012

(65) Prior Publication Data

US 2012/0211745 A1  Aug. 23, 2012

Related U.S. Application Data

(63) Continuation of application No. PCT/JP2009/065537, filed on Sep. 4, 2009.

(51) Int. Cl.
*H01L 29/786* (2006.01)
*B82Y 10/00* (2011.01)
*H01L 29/66* (2006.01)

(52) U.S. Cl.
CPC ............ *H01L 29/7869* (2013.01); *B82Y 10/00* (2013.01); *H01L 29/66969* (2013.01)

(58) Field of Classification Search
CPC ...................... H01L 27/14692; H01L 27/3272; H01L 29/41733; H01L 29/4908; H01L 29/7869; H01L 29/66742; B82Y 10/00
USPC ........ 438/149; 257/E27.1, E29.117, E29.137, 257/E29.145, E29.182, E29.202, E29.273, 257/E29.314, E29.32
See application file for complete search history.

(56) References Cited

U.S. PATENT DOCUMENTS

| | | | | |
|---|---|---|---|---|
| 5,731,856 A * | 3/1998 | Kim et al. | ........................ | 349/43 |
| 6,346,730 B1 * | 2/2002 | Kitakado | ............ | G02F 1/13454 |
| | | | | 257/296 |
| 6,424,012 B1 * | 7/2002 | Kawasaki | ......... | G02F 1/133345 |
| | | | | 257/350 |

(Continued)

FOREIGN PATENT DOCUMENTS

| CN | 101339954 A | 1/2009 |
|---|---|---|
| JP | 2001-196597 | 7/2001 |

(Continued)

OTHER PUBLICATIONS

Chinese Office Action issued Feb. 24, 2014, in China Patent Application No. 200980161251.5 (with English Tranlation).

(Continued)

*Primary Examiner* — Jarrett Stark
*Assistant Examiner* — Bitew Dinke
(74) *Attorney, Agent, or Firm* — Oblon, McClelland, Maier & Neustadt, L.L.P.

(57) ABSTRACT

According to one embodiment, a thin film transistor includes a gate electrode, a semiconductor layer, a gate insulating film, and a source electrode and a drain electrode. The semiconductor layer includes an oxide including at least one of gallium and zinc, and indium. The gate insulating film is provided between the gate electrode and the semiconductor layer. The source electrode and a drain electrode are electrically connected to the semiconductor layer and spaced from each other. The semiconductor layer includes a plurality of fine crystallites dispersed three-dimensionally in the semiconductor layer and has periodicity in arrangement of atoms.

23 Claims, 22 Drawing Sheets

(56) References Cited

U.S. PATENT DOCUMENTS

| | | | |
|---|---|---|---|
| 6,673,659 B2* | 1/2004 | Sakama et al. | 438/149 |
| 7,648,861 B2* | 1/2010 | Yamazaki et al. | 438/149 |
| 8,343,817 B2* | 1/2013 | Miyairi et al. | 438/151 |
| 2003/0015703 A1* | 1/2003 | Yamazaki et al. | 257/66 |
| 2005/0230838 A1* | 10/2005 | Ono et al. | 257/764 |
| 2007/0072439 A1* | 3/2007 | Akimoto et al. | 438/795 |
| 2007/0099400 A1* | 5/2007 | Kato et al. | 438/486 |
| 2008/0254569 A1* | 10/2008 | Hoffman et al. | 438/104 |
| 2008/0258141 A1* | 10/2008 | Park et al. | 257/43 |
| 2008/0296568 A1* | 12/2008 | Ryu et al. | 257/43 |
| 2009/0008638 A1 | 1/2009 | Kang et al. | |
| 2009/0166616 A1* | 7/2009 | Uchiyama | 257/43 |
| 2009/0269880 A1* | 10/2009 | Itagaki et al. | 438/104 |
| 2010/0025675 A1* | 2/2010 | Yamazaki et al. | 257/43 |
| 2010/0025676 A1* | 2/2010 | Yamazaki et al. | 257/43 |
| 2010/0025678 A1* | 2/2010 | Yamazaki et al. | 257/43 |
| 2010/0051940 A1* | 3/2010 | Yamazaki et al. | 257/43 |
| 2010/0051959 A1* | 3/2010 | Moriwaki | 257/72 |
| 2010/0193783 A1* | 8/2010 | Yamazaki et al. | 257/43 |
| 2010/0200843 A1* | 8/2010 | Arai et al. | 257/40 |
| 2010/0207118 A1* | 8/2010 | Sakata et al. | 257/43 |
| 2011/0062436 A1* | 3/2011 | Yamazaki et al. | 257/43 |
| 2011/0104851 A1* | 5/2011 | Akimoto et al. | 438/104 |
| 2011/0114936 A1* | 5/2011 | Akimoto et al. | 257/40 |
| 2011/0163311 A1* | 7/2011 | Akimoto et al. | 257/43 |
| 2011/0193081 A1* | 8/2011 | Godo et al. | 257/43 |
| 2011/0204362 A1* | 8/2011 | Akimoto et al. | 257/52 |
| 2011/0278577 A1* | 11/2011 | Yamazaki | 257/59 |
| 2012/0049193 A1* | 3/2012 | Saito et al. | 257/59 |
| 2012/0122277 A1* | 5/2012 | Yamazaki et al. | 438/104 |
| 2012/0168748 A1* | 7/2012 | Yano et al. | 257/43 |
| 2013/0092932 A1* | 4/2013 | Yamazaki et al. | 257/43 |
| 2013/0221348 A1* | 8/2013 | Yano et al. | 257/43 |

FOREIGN PATENT DOCUMENTS

| | | | |
|---|---|---|---|
| JP | 2002-261008 | | 9/2002 |
| JP | 2004-103957 A | | 4/2004 |
| JP | 2007035964 A | * | 2/2007 |
| JP | 2007-123861 A | | 5/2007 |
| JP | 2007-311404 A | | 11/2007 |
| JP | WO 2008023553 A1 | * | 2/2008 ... H01L 29/7869 |
| JP | 2008-53356 A | | 3/2008 |
| JP | 2008-053356 A | | 3/2008 |
| JP | 2008-243928 A | | 10/2008 |
| JP | 2009-16844 A | | 1/2009 |
| JP | 2009-164393 A | | 7/2009 |
| KR | 10-2008-0076608 | | 8/2008 |
| KR | 2008-0076608 | | 8/2008 |
| KR | 10-2009-0002841 | | 1/2009 |
| WO | WO 2008/023553 A1 | | 2/2008 |

OTHER PUBLICATIONS

Korean Office Action issued Apr. 4, 2014, in Korea Patent Application No. 10-2012-7005869 (with English translation).

Office Action issued Apr. 28, 2015, in Chinese Patent Application No. 200980161251.5, with English-language Translation.

Office Action issued on May 2, 2013 in the counterpart Japanese Patent Application No. 2011-529757 (with English Translation).

Office Action issued on May 6, 2013 in the counterpart Korean Patent Application No. 10-2012-7005869 (with English Translation).

Office Action issued Jul. 31, 2014 in Korean Patent Application No. 10-2014-7015250 (with English Translation).

Japanese Office Action issued on Oct. 21, 2013, in Japanese Patent Application No. 2011-529757 (with English Translation).

Office Action issued Nov. 3, 2014 in Chinese Patent Application No. 200980161251.5 (with English translation).

International Search Report mailed Sep. 28, 2009 in International Application No. PCT/JP2009/065537, filed Sep. 4, 2009.

International Written Opinion dated Sep. 28, 2009 in International Application No. PCT/JP2009/065537, filed Sep. 4, 2009.

Office Action issued Nov. 28, 2013 in Korean Patent Application No. 10-2012-7005869 (with English Translation).

* cited by examiner

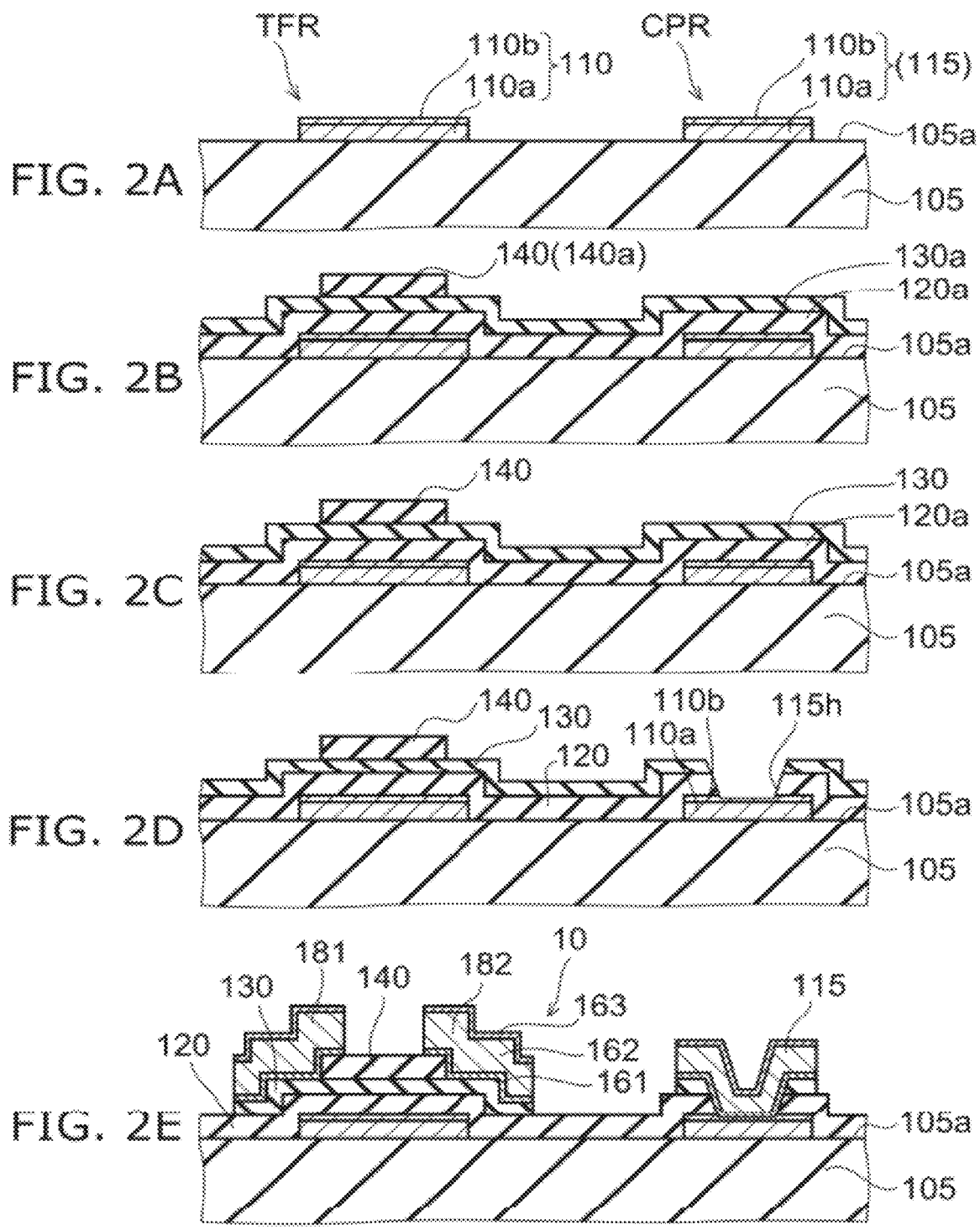

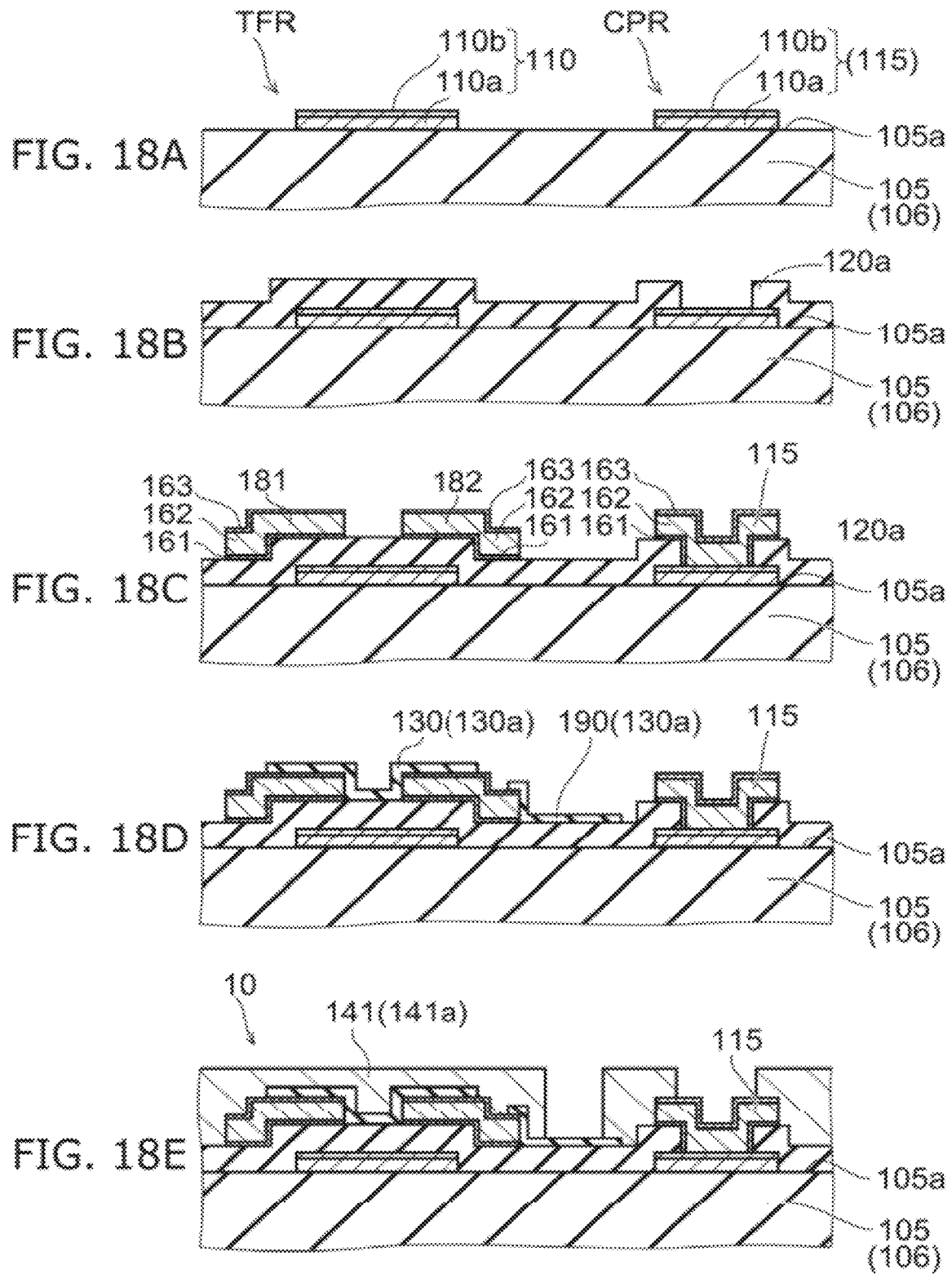

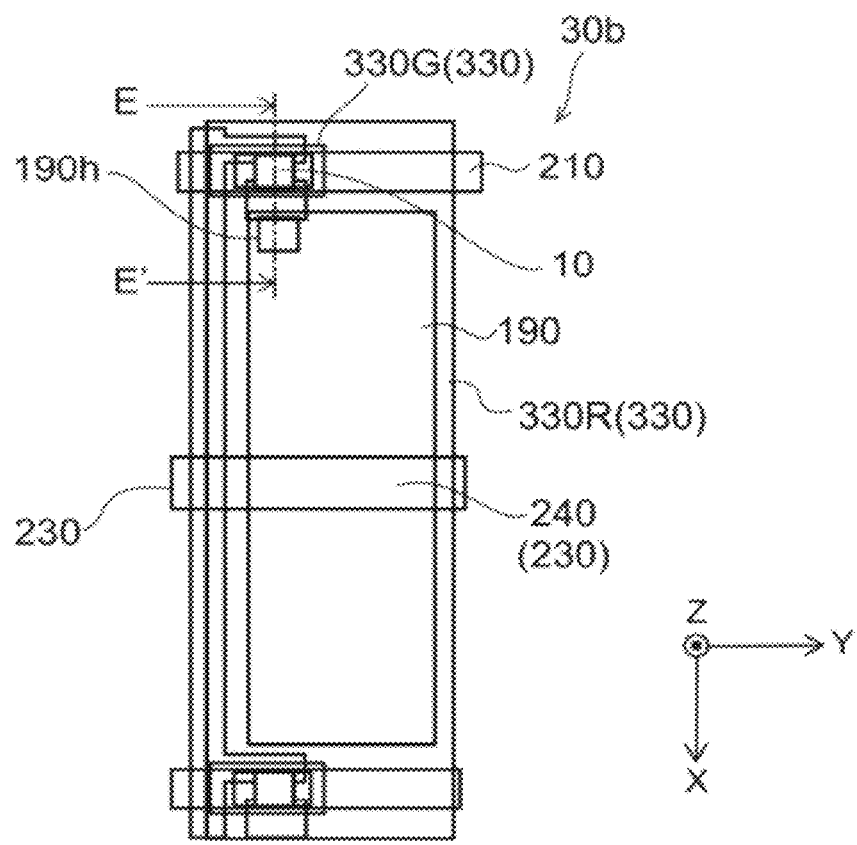
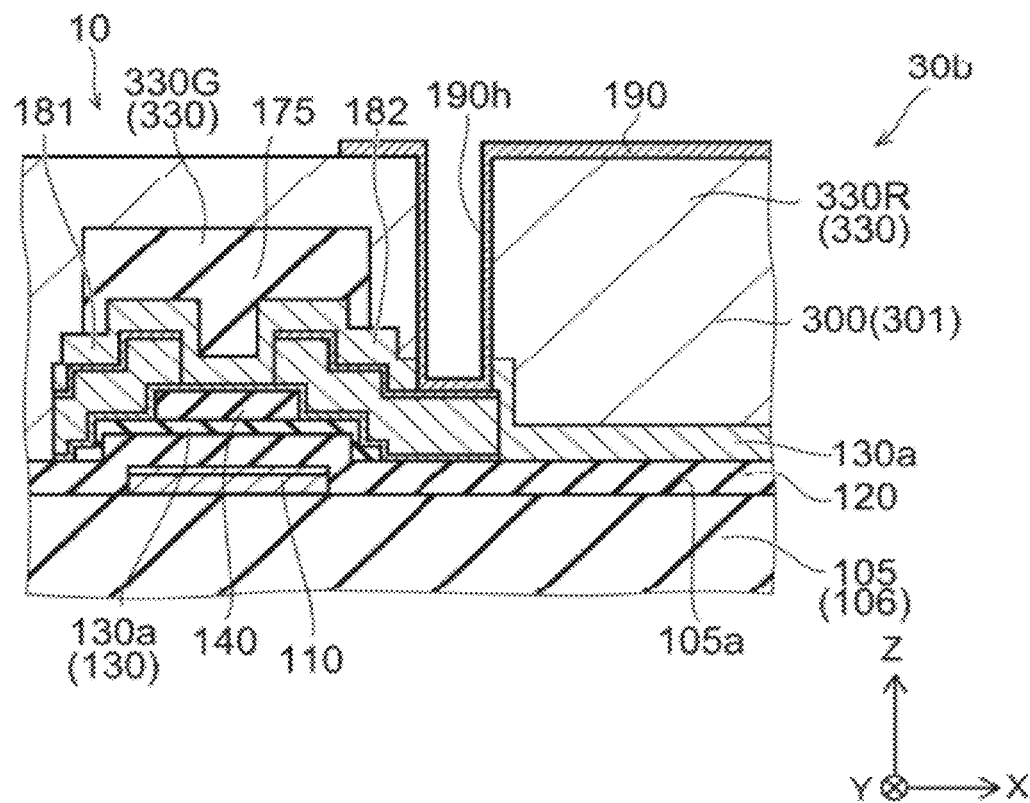

_US 9,209,311 B2_

THIN FILM TRANSISTOR AND METHOD FOR MANUFACTURING THE SAME

CROSS-REFERENCE TO RELATED APPLICATIONS

This is a continuation application of International Application PCT/JP2009/065537, filed on Sep. 4, 2009; the entire contents of which are incorporated herein by reference.

FIELD

Embodiments described herein relate generally to a thin film transistor and a method for manufacturing the same.

BACKGROUND

Thin film transistors (TFTs) are widely used in e.g. liquid crystal display devices and organic EL display devices. In particular, TFTs using amorphous silicon for the active layer are currently in widespread use for large liquid crystal display devices. However, there is demand for practical application of a novel active layer adaptable to e.g. larger size, higher reliability, and higher mobility in the future.

For instance, JP 2004-103957 A (Kokai) discloses a TFT using In—Ga—Zn—O-based amorphous oxide. This oxide can be film-formed at low temperature, and is transparent in the visible range. Hence, it has the potential to realize a transparent TFT that can be formed on a plastic substrate. Furthermore, a mobility of approximately 10 times that of amorphous silicon has been achieved.

In a TFT using such an oxide, further improvement in mobility is desired.

BRIEF DESCRIPTION OF THE DRAWINGS

FIGS. 2A to 2E are sequential schematic sectional views illustrating a method for manufacturing a thin film transistor;

FIGS. 18A to 18E are sequential schematic sectional views illustrating a method for manufacturing a thin film transistor and an active matrix display device;

FIGS. 19A and 19B are schematic views illustrating f an active matrix display device;

DETAILED DESCRIPTION

Figure 1A:
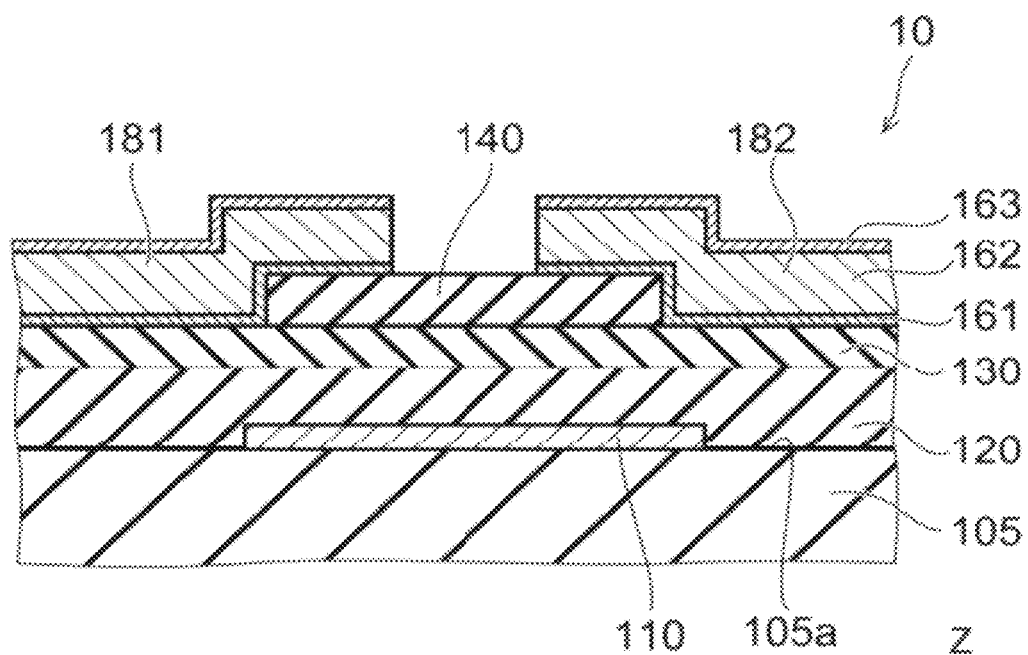
FIGS. 1A and 1B are schematic views illustrating a thin film transistor.

According to one embodiment, a thin film transistor includes a gate electrode, a semiconductor layer, a gate insulating film, and a source electrode and a drain electrode. The semiconductor layer includes an oxide including at least one of gallium and zinc, and indium. The gate insulating film is provided between the gate electrode and the semiconductor layer. The source electrode and a drain electrode are electrically connected to the semiconductor layer and spaced from each other. The semiconductor layer includes a plurality of fine crystallites dispersed three-dimensionally in the semiconductor layer and has periodicity in arrangement of atoms.

According to another embodiment, a method is disclosed for manufacturing a thin film transistor. The transistor includes a gate electrode, a semiconductor layer including an oxide including at least one of gallium and zinc, and indium, and including a plurality of fine crystallites dispersed three-dimensionally and having periodicity in arrangement of atoms, a gate insulating film provided between the gate electrode and the semiconductor layer, and a source electrode and a drain electrode electrically connected to the semiconductor layer and spaced from each other. The method can include forming a stacked film of the gate electrode, the gate insulating film, and an oxide film including at least one of gallium and zinc, and indium. The method can include forming the fine crystallites in the oxide film by heat treatment of the stacked film at 320° C. or more and 380° C. or less. In addition, the method can include forming the source electrode and the drain electrode so as to be connected to the oxide film. The forming the stacked film includes forming the oxide film on a major surface of a substrate, forming the gate insulating film made of a silicon oxide film on the oxide film, and forming the gate electrode on the gate insulating film so that the oxide film is covered with the gate insulating film. The forming the fine crystallites is performed in a state in which the oxide film is covered with the silicon oxide film constituting the gate insulating film.

According to another embodiment, a method is disclosed for manufacturing a thin film transistor. The transistor includes a gate electrode, a semiconductor layer including an oxide including at least one of gallium and zinc, and indium, and including a plurality of fine crystallites dispersed three-dimensionally and having periodicity in arrangement of atoms, a gate insulating film provided between the gate electrode and the semiconductor layer, and a source electrode and a drain electrode electrically connected to the semiconductor layer and spaced from each other. The method can include forming a stacked film of the gate electrode, the gate insulating film, and an oxide film including at least one of gallium and zinc, and indium. The method can include forming the fine crystallites in the oxide film by heat treatment of the stacked film at 320° C. or more and 380° C. or less. In addition, the method can include forming the source electrode and the drain electrode so as to be connected to the oxide film. The forming the stacked film includes forming the gate electrode on a major surface of a substrate, forming the gate insulating film on the gate electrode, forming the oxide film on the gate insulating film, and forming a channel protection layer made of a silicon oxide film on the oxide film so that the oxide film is covered with the channel protection layer. The forming fine crystallites is performed in a state in which the oxide film is covered with the silicon oxide film constituting the channel protection layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

Figure 1B:
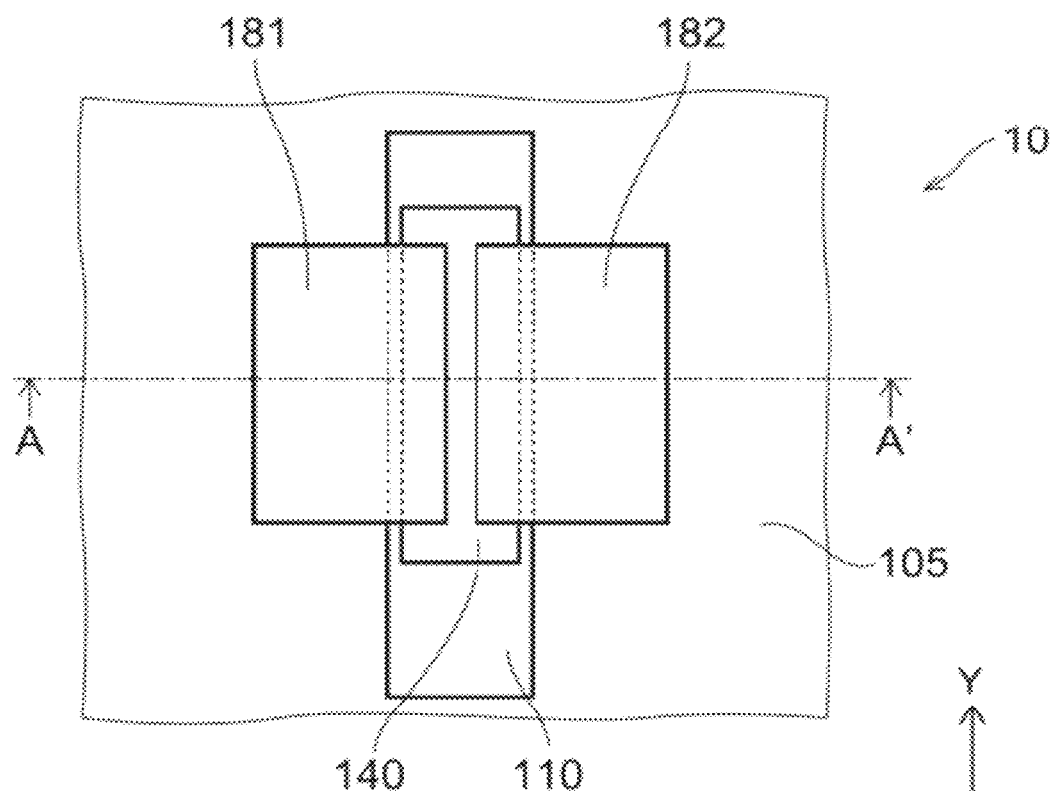

FIGS. 1A and 1B are schematic views illustrating the configuration of a thin film transistor according to a first embodiment.

More specifically, FIG. 1B is a schematic plan view, and FIG. 1A is a sectional view taken along line A-A' of FIG. 1B.

As shown in FIGS. 1A and 1B, the thin film transistor 10 according to the first embodiment includes a gate electrode 110, a semiconductor layer 130 provided facing the gate electrode 110, a gate insulating film 120 provided between the gate electrode 110 and the semiconductor layer 130, and a source electrode 181 and a drain electrode 182 electrically connected to the semiconductor layer 130 and spaced from each other.

Here, for convenience of description, the direction perpendicular to the interface between the semiconductor layer 130 and the gate insulating film 120 is defined as Z-axis direction. One direction parallel to the interface is defined as X-axis direction. The direction perpendicular to the Z-axis direction and the X-axis direction is defined as Y-axis direction. The X-axis direction is aligned with the direction in which the source electrode 181 and the drain electrode 182 are opposed to each other.

The gate electrode 110, the gate insulating film 120, and the semiconductor layer 130 are stacked in the Z-axis direction.

The semiconductor layer 130 includes an oxide including at least one of gallium and zinc, and indium. More specifically, the semiconductor layer 130 is e.g. an oxide film including In, Ga, and Zn (i.e., In—Ga—Zn—O oxide film). Alternatively, the semiconductor layer 130 may be an oxide film including In and Ga (i.e., In—Ga—O oxide film). Alternatively, the semiconductor layer 130 may be an oxide film including In and Zn (i.e., In—Zn—O oxide film). In the following, the In—Ga—Zn—O oxide film, the In—Ga—O oxide film, and the In—Zn—O oxide film are collectively referred to as "InGaZnO film".

The semiconductor layer 130 includes a plurality of fine crystallites having periodicity in the arrangement of atoms. That is, each of the fine crystallites has periodicity therein. For instance, in each of the fine crystallites, the arrangement of atoms included in the semiconductor layer 130 has a certain periodicity. More typically, each of the fine crystallites has a periodicity related to the arrangement of metallic atoms included in the above oxide.

The fine crystallites are dispersed three-dimensionally in the semiconductor layer 130. That is, the fine crystallites are dispersed in any of the Z-axis direction, X-axis direction, and Y-axis direction inside the semiconductor layer 130. The dispersed state of the fine crystallites in the semiconductor layer 130 is described later.

In the foregoing, the source electrode 181 and the drain electrode 182 may be interchanged.

In this example, the source electrode 181 and the drain electrode 182 have a stacked structure of a Mo film 161, an Al film 162, and a Mo film 163. However, the embodiment is not limited thereto. The structure of the source electrode 181 and the drain electrode 182 and the material used therein are arbitrary.

As the substrate 105, for instance, a light transmissive glass substrate or a light transmissive plastic substrate can be used. However, the substrate 105 is not limited thereto. For instance, the substrate 105 may be made of an insulating layer provided on a non-light transmissive base material such as silicon and stainless steel. For instance, the substrate 105 only needs to be insulative at the surface of the portion where the gate electrode 110 is provided.

The gate electrode 110 can be made of a high melting point metal such as MoW, Ta, and W. Alternatively, the gate electrode 110 may be made of an Al alloy composed primarily of Al with hillock prevention, or made of Cu with lower resistance. However, the embodiment is not limited thereto. The gate electrode 110 can be made of any conductive material.

In this example, a channel protection layer 140 is provided on the semiconductor layer 130. The source electrode 181 and the drain electrode 182 overlie part of the channel protection layer 140. The semiconductor layer 130 is covered with one of the channel protection layer 140, the source electrode 181, and the drain electrode 182.

The channel protection layer 140 can be made of a silicon oxide film.

To improve durability of the thin film transistor 10, for instance, a passivation film made of an insulator such as $SiN_x$ may be provided so as to cover the structure illustrated in FIGS. 1A and 1B (gate electrode 110, gate insulating film 120, semiconductor layer 130, channel protection layer 140, source electrode 181, and drain electrode 182).

Here, as described later, for instance, the channel protection layer 140 may be made of a silicon oxide film. The channel protection layer 140 may cover the semiconductor layer 130, the source electrode 181, and the drain electrode 182. Further thereon, a passivation film of e.g. $SiN_x$ may be provided.

In the following, an example method for manufacturing the thin film transistor 10 according to the embodiment is described.

FIGS. 2A to 2E are sequential schematic sectional views illustrating the method for manufacturing a thin film transistor according to the first embodiment.

In these figures, the left portion corresponds to a TFT region TFR where the thin film transistor 10 is formed, and the right portion corresponds to a connecting portion region CPR where the connecting portion 115 of the wiring connected to the gate electrode 110 of the thin film transistor 10 is formed.

First, as shown in FIG. 2A, for instance, on the major surface 105a of a substrate 105 made of glass, an Al film 110a and a Mo film 110b constituting a gate electrode 110 are formed by e.g. sputtering to a thickness of 150 nm (nanometers) and 30 nm, respectively, and processed into a prescribed pattern shape. At this time, also in the connecting portion region CPR, an Al film 110a and a Mo film 110b constituting part of a connecting portion 115 are processed into a prescribed pattern shape.

In this processing, photolithography is used. For etching, for instance, a mixed acid of phosphoric acid, acetic acid, and nitric acid is used.

Next, as shown in FIG. 2B, a $SiO_2$ film 120a constituting a gate insulating film 120 is formed to a thickness of e.g. 350 nm by e.g. the plasma enhanced chemical vapor deposition (PE-CVD) method with TEOS (tetraethyl orthosilicate). The film formation temperature at this time is preferably e.g. 300° C. or more.

Here, the film structure of the semiconductor layer 130 to be formed on the gate insulating film 120 is varied with the surface morphology of the gate insulating film 120. Hence, the film formation condition of the $SiO_2$ film 120a constituting the gate insulating film 120 is selected so that the surface of the gate insulating film 120 becomes as flat as possible. Use of a gate insulating film 120 with a flat surface decreases the characteristics variation of the thin film transistor 10 due to the gate electric field stress. The surface of the gate insulating film 120 after film formation may be smoothed by using a method such as CMP (chemical mechanical polishing) processing, RIE processing, and argon sputtering processing for slightly etching the surface layer.

Furthermore, on the $SiO_2$ film 120a, an InGaZnO film 130a (e.g., $In_2O_3$—$Ga_2O_3$—ZnO film) constituting a semiconductor layer 130 is formed to a thickness of e.g. 30 nm by e.g. the reactive DC sputtering method. At this time, the composition ratio of the target used is e.g. 1:1:1 in terms of the atomic ratio of In:Ga:Zn. This film formation is performed in an atmosphere including oxygen and argon. The proportion of oxygen is set to e.g. approximately 5% relative to argon. The film formation temperature is approximately several ten degrees C., because no particular heating, for instance, is performed.

Furthermore, a $SiO_2$ film 140a constituting a channel protection layer 140 is formed by e.g. the PE-CVD method with TEOS to a thickness of e.g. 200 nm. At this time, the substrate temperature during film formation is set to 230° C. That is, the substrate temperature during the film formation of the $SiO_2$ film 140a constituting the channel protection layer 140 is preferably 230° C. or more. If the substrate temperature during the film formation of the $SiO_2$ film 140a is lower than 230° C., the amount of carbon and hydrogen left in the film increases. Hence, fixed charges are more likely to occur in the film by charge injection from the source/drain electrode and the electric field stress due to the negative potential of the gate. This increases the characteristics variation of the thin film transistor.

Next, the $SiO_2$ film 140a is processed into a prescribed pattern shape to form a channel protection layer 140. In this processing of the $SiO_2$ film 140a, mask exposure is combined with back surface exposure using the gate electrode 110 as a mask to perform photolithography. For etching of the $SiO_2$ film 140a, for instance, the RIE (reactive ion etching) method with $CF_4$ is adopted.

Next, as shown in FIG. 2C, in an annealing furnace with an ambient atmosphere, the workpiece is held for one hour at a prescribed annealing temperature Ta to perform annealing treatment (heat treatment). In this example, a treatment in an ambient atmosphere including oxygen is adopted. However, alternatively, the atmosphere in the annealing furnace may be nitrogen.

Here, experimentally, the annealing temperature Ta was set to eight values, i.e., 250° C., 280° C., 300° C., 320° C., 340° C., 360° C., 380° C., and 400° C. Furthermore, a sample without annealing treatment was also fabricated as a comparative example.

As described later, by appropriately setting the annealing temperature Ta, fine crystallites having periodicity in the arrangement of atoms are formed in the InGaZnO film 130a. Thus, a semiconductor layer 130 including fine crystallites can be formed.

After this annealing treatment, as shown in FIG. 2D, in the connecting portion region CPR, the semiconductor layer 130 (InGaZnO film 130a) and the gate insulating film 120 ($SiO_2$ film 120a) are selectively removed to form a contact hole 115h for forming a connecting portion 115. In this processing, the InGaZnO film 130a of the semiconductor layer 130 is etched with e.g. dilute hydrochloric acid. Then, the $SiO_2$ film 120a of the gate insulating film 120 is etched by e.g. RIE with $CF_4$. This contact hole 115h reaches e.g. the Mo film 110b constituting part of the connecting portion 115.

Next, as shown in FIG. 2E, a Mo film 161, an Al film 162, and a Mo film 163 constituting a source electrode 181 and a drain electrode 182 are formed by e.g. the sputtering method to a thickness of e.g. 30 nm, 300 nm, and 50 nm, respectively. Then, the Mo film 161, the Al film 162, and the Mo film 163 are processed into a prescribed pattern shape with e.g. a mixed acid of phosphoric acid, acetic acid, and nitric acid to form a source electrode 181 and a drain electrode 182. At this time, the semiconductor layer 130 in the portion not covered with the source electrode 181, the drain electrode 182, and the channel protection layer 140 is removed by etching. Thus, the shape of the thin film transistor 10 is formed. Furthermore, a connecting portion 115 serving as the extraction portion of a wiring connected to the gate electrode 110 is formed.

Next, a passivation film, not shown, is formed appropriately. Furthermore, to remove damage during the process, for instance, a damage removal treatment for approximately one hour at 230° C. is performed. Thus, the thin film transistor 10 illustrated in FIGS. 1A and 1B is completed.

The characteristics of the thin film transistor thus manufactured are now described.

FIGS. 3A to 3I are graphs illustrating the characteristics of the thin film transistor according to the first embodiment.

More specifically, FIGS. 3A to 3I illustrate the voltage-current characteristics of the thin film transistor under the condition of no annealing treatment and the condition where the annealing temperature Ta of annealing treatment is 250° C., 280° C., 300° C., 320° C., 340° C., 360° C., 380° C., and 400° C., respectively, described with reference to FIG. 2C. In these figures, the horizontal axis represents gate voltage Vg, and the vertical axis represents drain current Id.

Here, the thin film transistor 10 has a channel width of 26 μm (micrometers) and a channel length of 11 μm. The source-drain voltage Vd between the source electrode 181 and the drain electrode 182 was set to 15 V (volts). In the measurement of voltage-current characteristics, a double-sweep measurement at the time of increasing and decreasing the gate voltage Vg was performed.

Figure 3A:
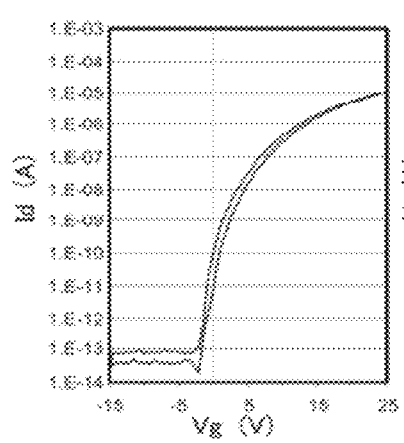
FIGS. 3A to 3I are graphs illustrating the characteristics of the thin film transistor.
Figure 3B:
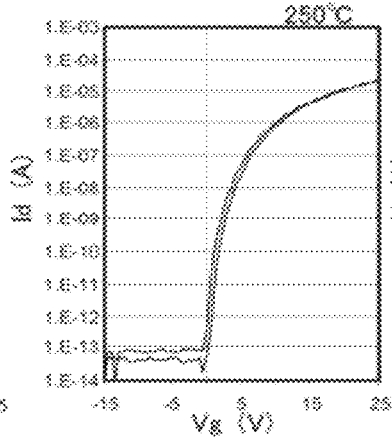
Figure 3C:
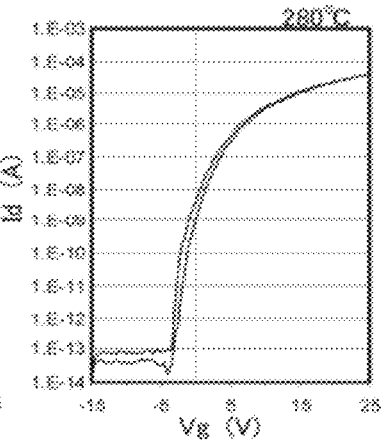
Figure 3D:
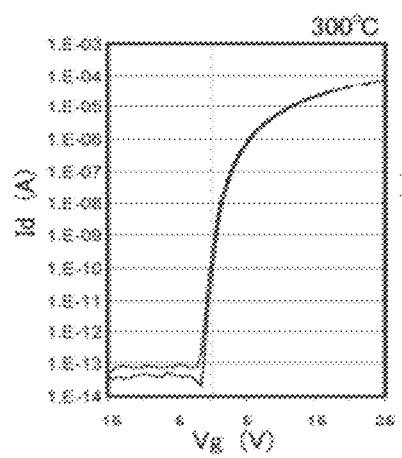
Figure 3E:
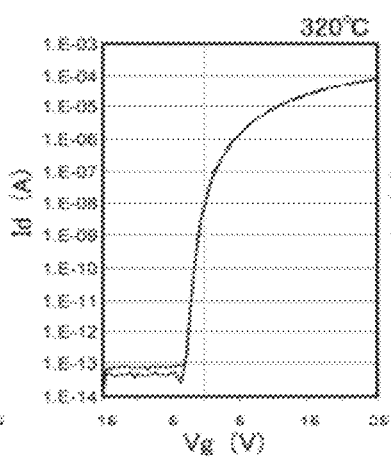
Figure 3F:
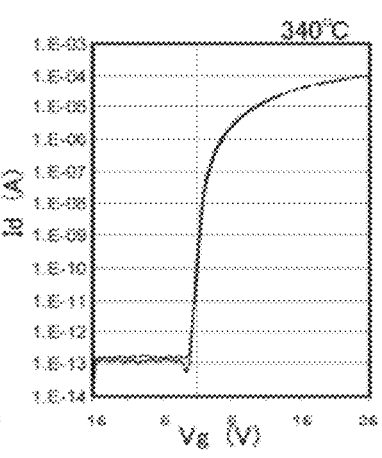
Figure 3G:
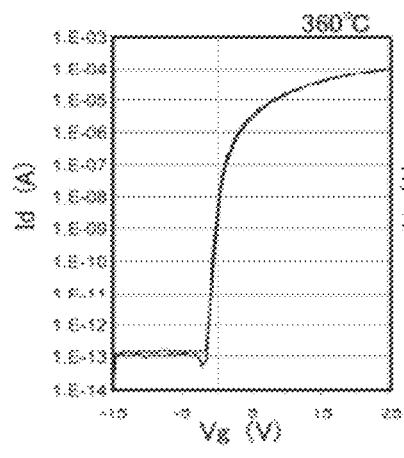
Figure 3H:
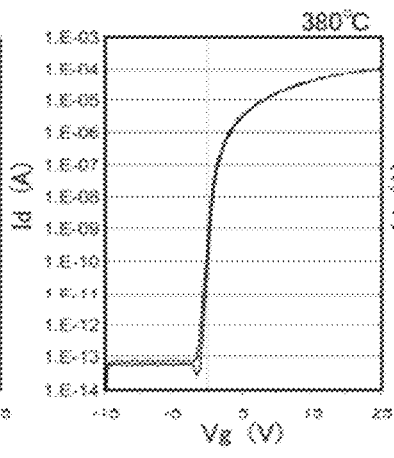
Figure 3I:
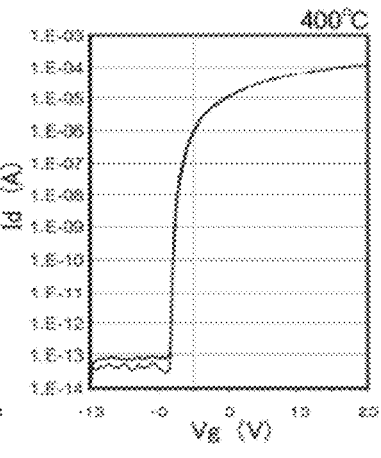

As shown in FIGS. 3A to 3C, in the case of no annealing treatment and the cases of an annealing temperature Ta of 250° C. and 280° C., the voltage-current characteristics exhibited hysteresis.

In contrast, as shown in FIGS. 3D to 3I, in the case where the annealing temperature Ta is 300° C. or more, the voltage-current characteristics exhibited no hysteresis.

Thus, at an annealing temperature Ta of 300° C. or more, good voltage-current characteristics with no hysteresis are achieved.

Furthermore, from these results, the mobility μ and the threshold voltage Vth of the thin film transistor were calculated. Here, the mobility μ and the threshold voltage Vth were calculated from the characteristics in the saturation region ($Id = \frac{1}{2} \cdot C_{ox} \cdot \mu \cdot W/L \cdot (Vg - Vth)^2$, where $C_{ox}$ is the gate insulating film capacitance per unit area, W is the channel width, and L is the channel length) at a source-drain voltage Vd of 15 V in the voltage-current characteristics illustrated in FIGS. 3A to 3I.

Figure 4A:
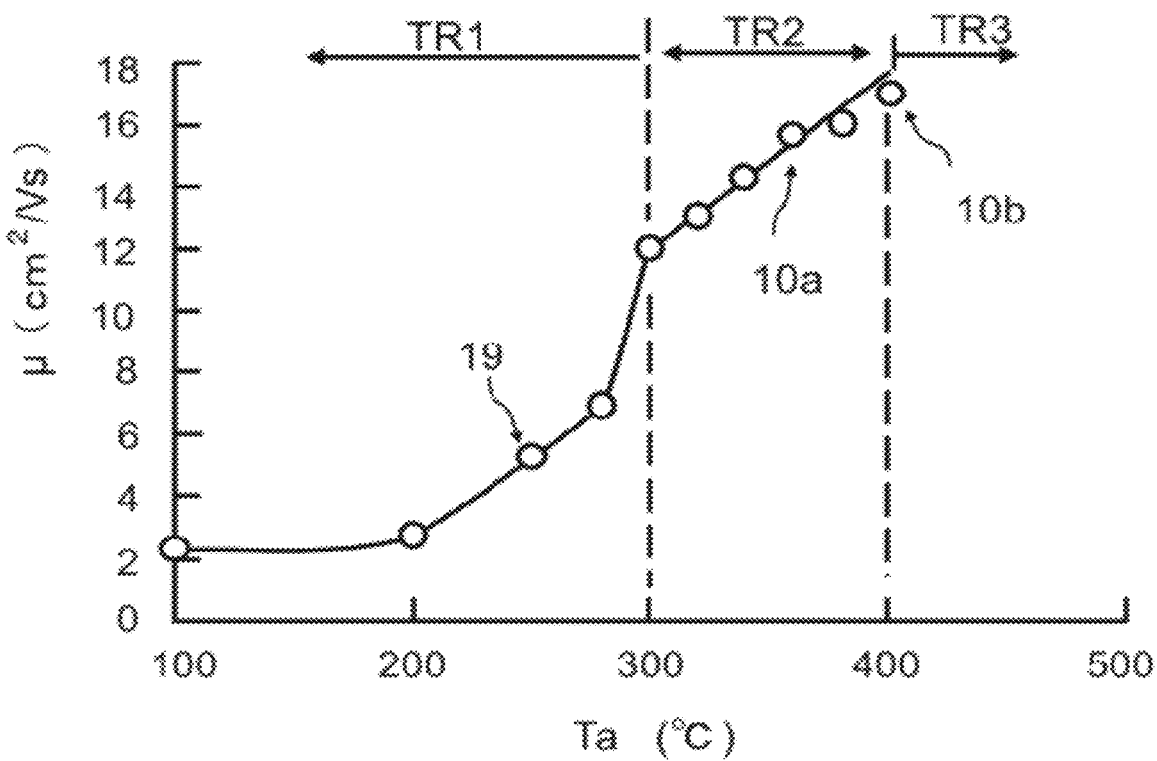
FIGS. 4A and 4B are graphs illustrating the characteristics of the thin film transistor.
Figure 4B:
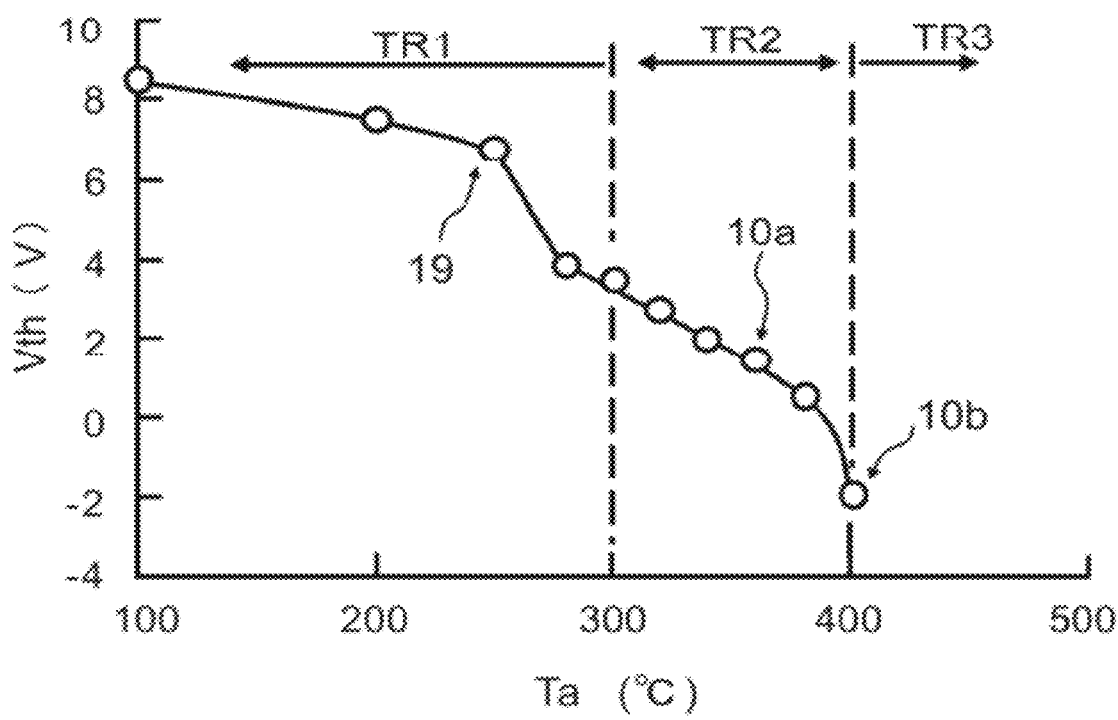

FIGS. 4A and 4B are graphs illustrating the characteristics of the thin film transistor according to the first embodiment.

More specifically, FIG. 4A shows the relationship between mobility μ and annealing temperature Ta. FIG. 4B shows the relationship between threshold voltage Vth and annealing temperature Ta. The horizontal axis in these figures represents annealing temperature Ta. The vertical axis of FIG. 4A represents mobility μ. The vertical axis of FIG. 4B represents threshold voltage Vth.

As shown in FIGS. 4A and 4B, in the case where the annealing temperature Ta was 280° C. or less, the mobility μ was 7 cm$^2$/Vs or less, and the threshold voltage Vth was 3.8 V or more.

On the other hand, in the case where the annealing temperature Ta was 300° C. or more, the mobility μ was 12 cm$^2$/Vs or more, and the threshold voltage Vth was 3.5 V or less.

That is, if the annealing temperature Ta is 300 or more, the mobility μ sharply increases.

At an annealing temperature Ta of 320-380° C., the mobility μ is 13-16 cm$^2$/Vs, and the threshold voltage Vth is 2.7-0.5 V.

Furthermore, in the case where the annealing temperature Ta was 400° C., the mobility μ further increased to 17 cm$^2$/Vs, whereas the threshold voltage Vth significantly decreased to a negative value of −2 V.

Thus, in the first temperature range TR1 of the annealing temperature Ta of 280° C. or less, the mobility μ is small, and the threshold voltage Vth is large.

In the second temperature range TR2 of the annealing temperature Ta of 300° C. or more and less than 400° C., the mobility μ significantly increases, and the threshold voltage Vth decreases.

That is, the mobility μ discontinuously and sharply increases when the annealing temperature Ta is increased from 280° C. to 300° C. The threshold voltage Vth discontinuously and sharply decreases when the annealing temperature Ta is increased from 250° C. to 280° C.

In the third temperature range TR3 of the annealing temperature Ta of 400° C. or more, the mobility μ increases, whereas the threshold voltage Vth sharply decreases.

Among them, the second temperature range TR2 and the third temperature range TR3 correspond to the thin film transistor according to the embodiment. Here, the case where the annealing temperature Ta is 360° C. is referred to as a thin film transistor 10a according to the embodiment. The case where the annealing temperature Ta is 400° C. is referred to as a thin film transistor 10b according to the embodiment.

On the other hand, the first temperature range TR1 corresponds to the comparative example. Here, the case where the annealing temperature Ta is 250° C. in the first temperature range TR1 is referred to as a thin film transistor 19 according to the comparative example.

In the following, the result of analyzing the structure of the semiconductor layer 130 of these thin film transistors 10a, 10b, and 19 by a transmission electron microscope (TEM) is described. Furthermore, the image obtained by digital Fourier transformation of the TEM image is also analyzed. This result is also described.

Figure 5A:
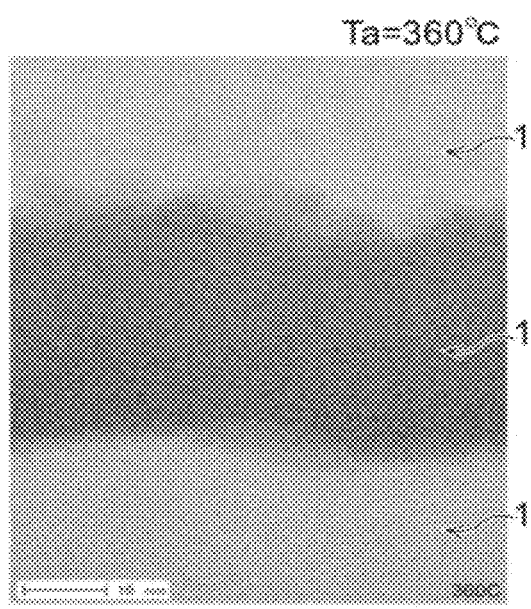
FIGS. 5A to 5C are transmission electron microscope images of the semiconductor layer in the thin film transistor.
Figure 5B:
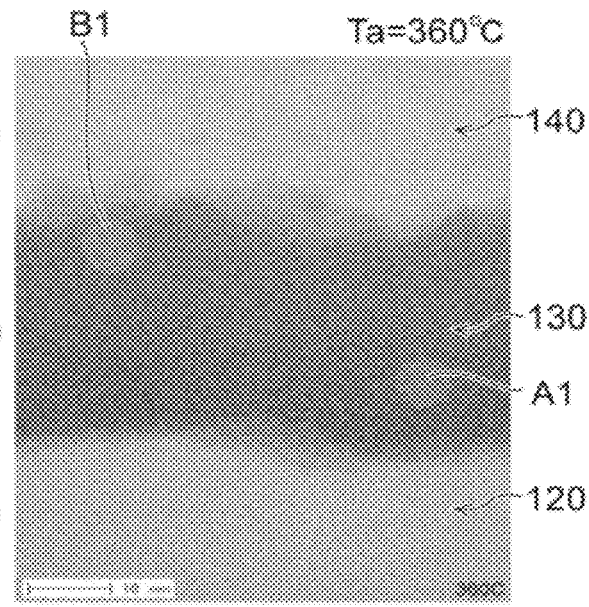
Figure 5C:
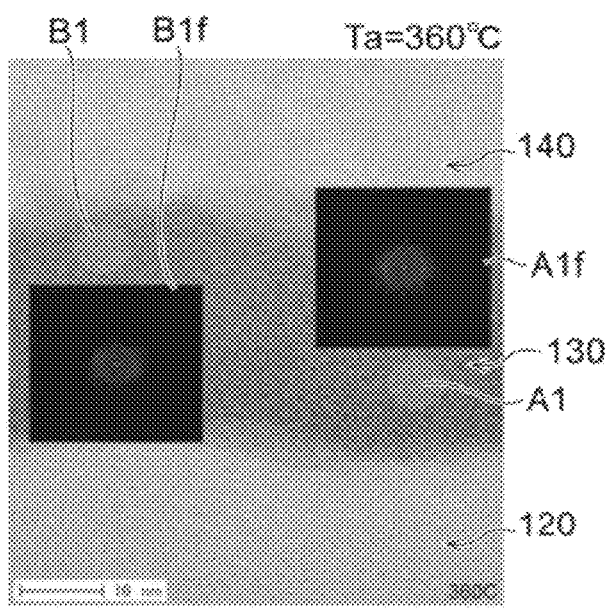

FIGS. 5A to 5C are transmission electron microscope images of the semiconductor layer in the thin film transistor according to the first embodiment.

More specifically, FIG. 5A is a TEM image of the semiconductor layer 130 of the above thin film transistor 10a where the annealing temperature Ta is 360° C. FIG. 5B shows region A1 and region B1 to be Fourier transformed in the image of FIG. 5A. FIG. 5C shows a Fourier transformed image A1*f* and a Fourier transformed image B1*f* obtained by Fourier transforming the region A1 and the region B1 in the image of FIG. 5A. In FIG. 5C, for clarity of illustration, the display position of the Fourier transformed image A1*f* and the Fourier transformed image B1*f* is displaced from the position of the region A1 and the region B1, respectively, of the underlying TEM image.

Figure 6A:
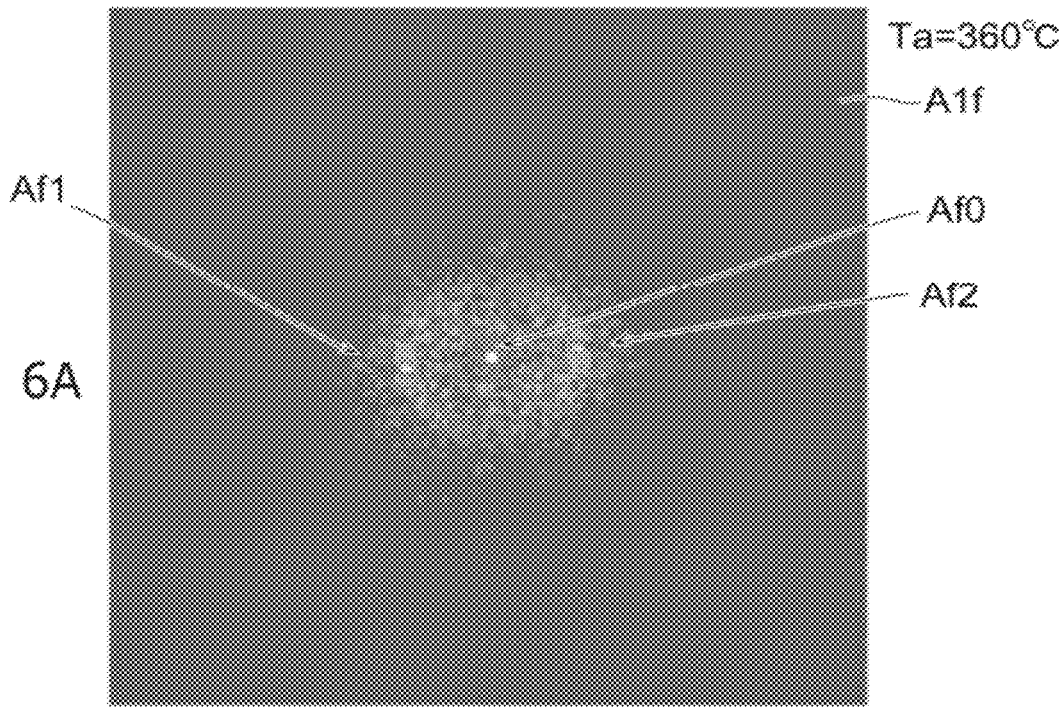
FIGS. 6A and 6B illustrate Fourier transformed images of the transmission electron microscope images of the semiconductor layer.
Figure 6B:
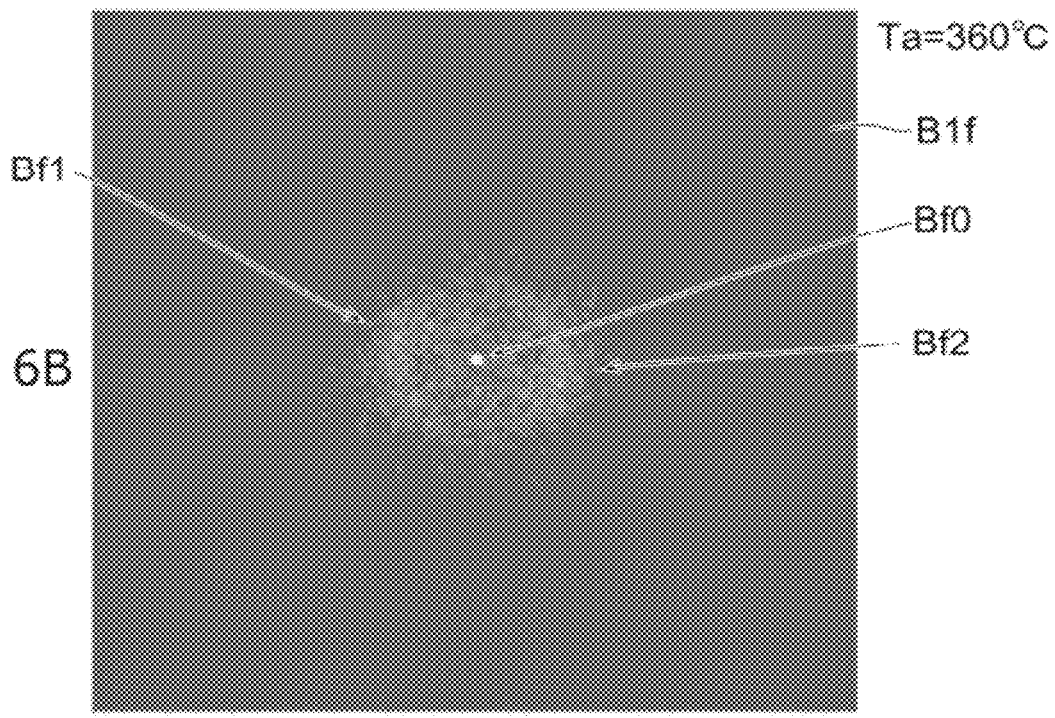

FIGS. 6A and 6B illustrate Fourier transformed images of the transmission electron microscope images of the semiconductor layer in the thin film transistor according to the first embodiment.

More specifically, FIGS. 6A and 6B are enlarged images of the Fourier transformed image A1*f* and the Fourier transformed image B1*f*, respectively, illustrated in FIG. 5C.

FIGS. 7A to 7D are transmission electron microscope images of the semiconductor layer in the thin film transistor according to the first embodiment.

Figure 7A:
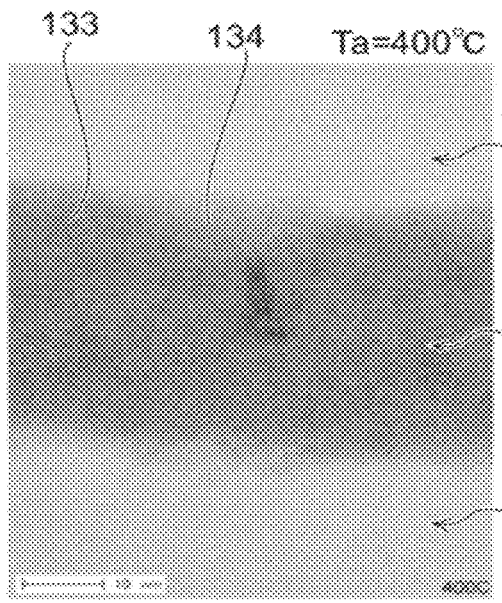
FIGS. 7A to 7D are transmission electron microscope images of the semiconductor layer in the thin film transistor.
Figure 7B:
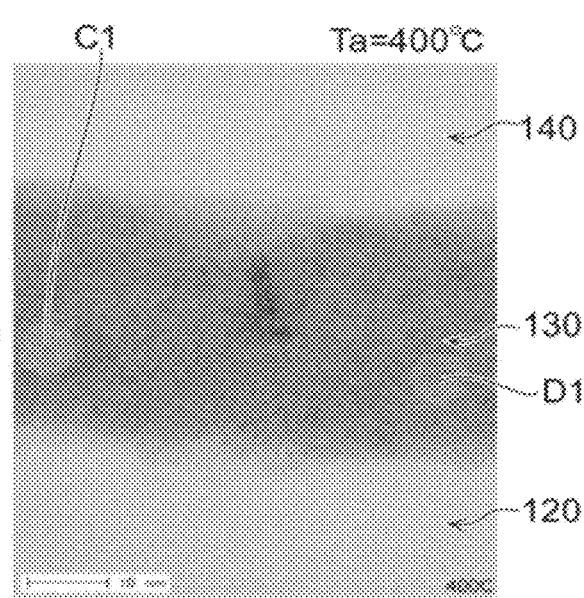
Figure 7C:
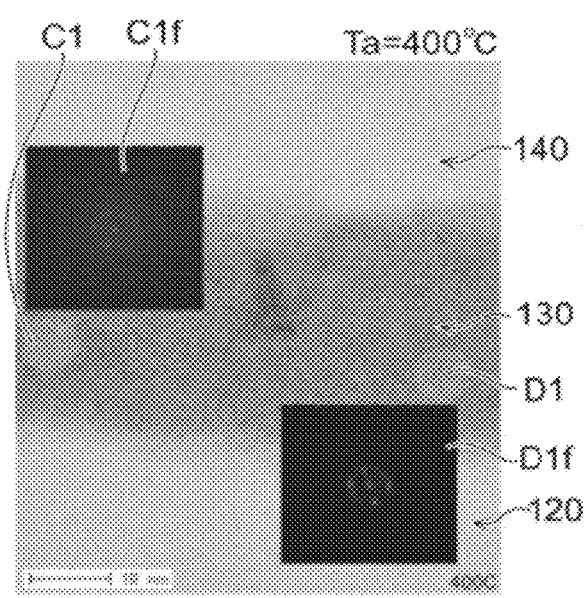
Figure 7D:
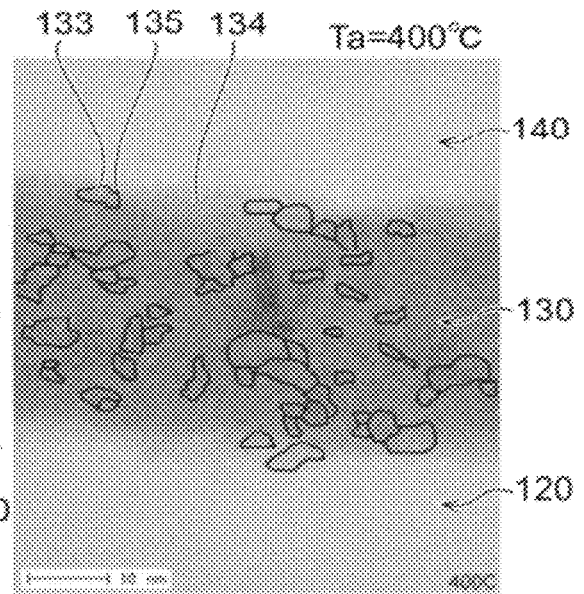

More specifically, FIG. 7A is a TEM image of the semiconductor layer 130 of the above thin film transistor 10b where the annealing temperature Ta is 400° C. FIG. 7B shows region C1 and region D1 to be Fourier transformed in the image of FIG. 7A. FIG. 7C shows a Fourier transformed image C1*f* and a Fourier transformed image D1*f* obtained by Fourier transforming the region C1 and the region D1 in the image of FIG. 7A. In FIG. 7C, for clarity of illustration, the display position of the Fourier transformed image C1*f* and the Fourier transformed image D1*f* is displaced from the position of the region C1 and the region D1, respectively, of the underlying image. FIG. 7D shows fine crystallites observed in FIG. 7A, which are shown by solid lines for clarity of illustration.

Figure 8A:
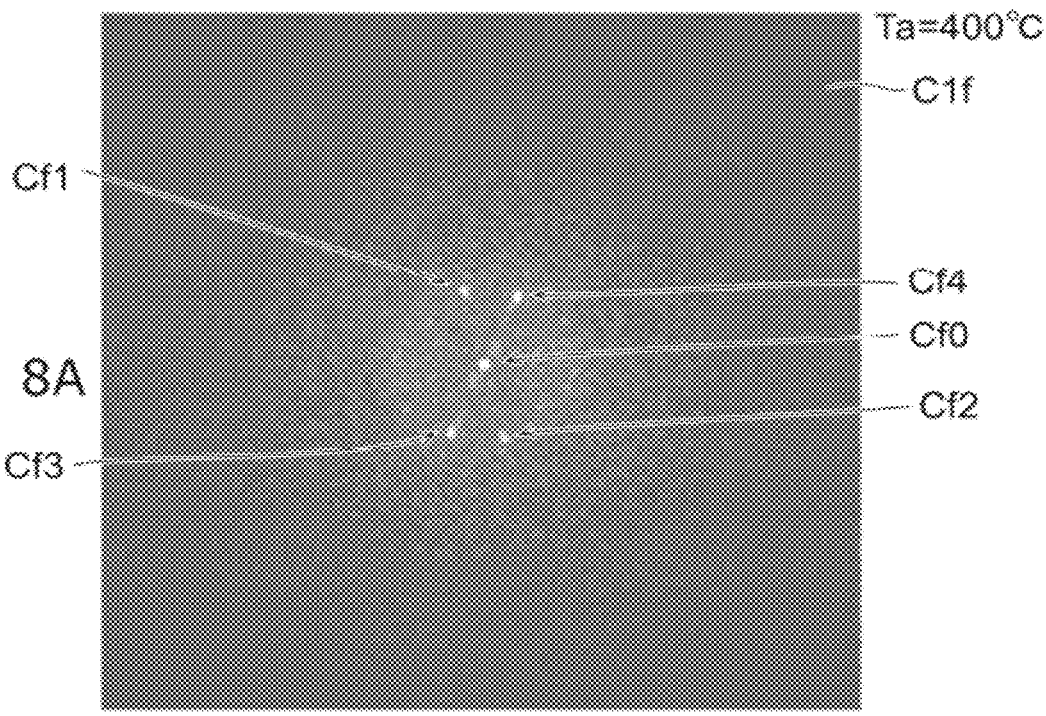
FIGS. 8A and 8B illustrate Fourier transformed images of the transmission electron microscope images of the semiconductor layer.
Figure 8B:
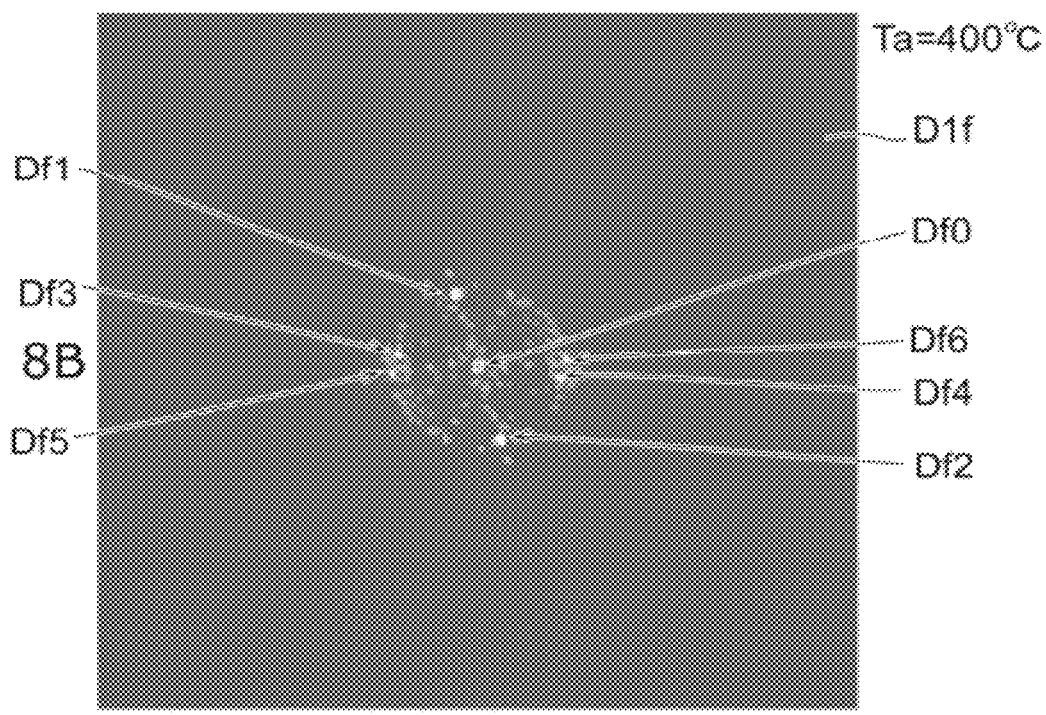

FIGS. 8A and 8B illustrate Fourier transformed images of the transmission electron microscope images of the semiconductor layer in the thin film transistor according to the first embodiment.

More specifically, FIGS. 8A and 8B are enlarged images of the Fourier transformed image C1*f* and the Fourier transformed image D1*f*, respectively, illustrated in FIG. 7C.

As shown in FIGS. 7A and 7D, in the case where the annealing temperature Ta is 400° C., a plurality of fine crystallites 133 are observed in the semiconductor layer 130. The fine crystallite 133 is a region having periodicity therein. A boundary 135 can be recognized between the fine particle 133 and the region 134. Inside the fine crystallite 133, a striped pattern based on the periodicity is observed. On the other hand, in the region 134, no striped pattern is observed. The region 134 has lower periodicity than the fine crystallite 133. This striped pattern corresponds to the lattice image based on the periodicity in the fine crystallite 133. That is, in the case where the annealing temperature Ta is 400° C., a lattice image is observed in the TEM image of the semiconductor layer 130.

As shown in FIG. 7B, partial regions (Fourier transform region C1 and Fourier transform region D1) of the TEM image of the semiconductor layer 130 are Fourier transformed.

As shown in FIG. 7C, in the Fourier transformed image C1f and the Fourier transformed image D1f obtained by Fourier transforming the Fourier transform region C1 and the Fourier transform region D1, respectively, of this TEM image, the same image in principle as the electron beam diffraction pattern is observed based on the internal periodicity of the fine crystallite 133.

More specifically, as illustrated in FIG. 8A, in the Fourier transformed image C1f, besides the bright spot Cf0 at the center, bright spots Cf1-Cf4 are observed at positions point-symmetric about the bright spot Cf0. These bright spots Cf1-Cf4 are diffraction pattern images based on the internal periodic structure of the Fourier transform region C1.

As illustrated in FIG. 8B, in the Fourier transformed image D1f, besides the bright spot Df0 at the center, bright spots Df1-Df6 are observed at positions point-symmetric about the bright spot Df0. These bright spots Df1-Df6 are diffraction pattern images based on the internal periodicity of the Fourier transform region D1. Here, in the image of FIG. 8B, the pair of the bright spot Df3 and the bright spot Df4 and the pair of the bright spot Df5 and the bright spot Df6 are vertically close to each other in the figure. It is conjectured that these pairs correspond to two different fine crystallites located in the imaging depth direction in the sample used for imaging the TEM image.

Thus, in the semiconductor layer 130 where the annealing temperature Ta is 400° C., fine crystallites 133 having periodicity in the arrangement of atoms are formed. That is, in the TEM image, the shape of the fine crystallite 133 can be recognized, and a lattice image is observed. Furthermore, in the Fourier transformed image of the TEM image, a diffraction pattern image is observed.

On the other hand, as shown in FIG. 5A, in the TEM image where the annealing temperature Ta is 360° C., fine crystallites are not clearly observed in the semiconductor layer 130.

As shown in FIG. 5B, partial regions (Fourier transform region A1 and Fourier transform region B1) of the TEM image of the semiconductor layer 130 are Fourier transformed.

As shown in FIG. 5C, in the Fourier transformed image A1f and the Fourier transformed image B1f obtained by Fourier transforming the Fourier transform region A1 and the Fourier transform region B1, respectively, of this TEM image, diffraction pattern images are not clearly observed. However, bright spots based on periodicity are observed.

More specifically, as illustrated in FIG. 6A, in the Fourier transformed image A1f, besides the bright spot Af0 at the center, bright spots Af1 and Af2 are observed at positions point-symmetric about the bright spot Af0. These bright spots Af1 and Af2 are images due to the diffraction phenomenon based on the internal periodicity of the Fourier transform region A1.

As illustrated in FIG. 6B, also in the Fourier transformed image B1f, bright spots Bf1 and Bf2 are observed at positions point-symmetric about the bright spot Bf0. These bright spots Bf1 and Bf2 are also images due to the diffraction phenomenon based on the internal periodicity of the Fourier transform region B1.

Thus, at an annealing temperature Ta of 360° C., no clear shape of fine crystallites 133 can be recognized in the TEM image, and no lattice image is observed. However, in the Fourier transformed image of the TEM image, bright spots Af1 and Af2 and bright spots Bf1 and Bf2 based on periodicity are observed. Thus, it can be determined that fine crystallites 133 having periodicity are formed in the semiconductor layer 130.

On the other hand, although not shown, in the thin film transistor 19 where the annealing temperature Ta is 250° C., no fine crystallite was recognized in the TEM image of the semiconductor layer 130, and no lattice image was observed. Furthermore, also in the Fourier transformed image of the TEM image, no bright spot based on periodicity was observed.

That is, it is considered as follows. At a low annealing temperature Ta of 250° C., no fine crystallite is formed. At an annealing temperature of 360° C., although in a very small region, fine crystallites 133 having periodicity therein are formed. With the increase of the annealing temperature Ta, the size of the fine crystallite 133 increases. At an annealing temperature Ta of 400° C., the fine crystallite 133 is grown to such a size that the fine crystallite 133 is observed in the TEM image.

In view of the performance of the current observation means (TEM), it is considered as follows. The semiconductor layer 130 includes relatively heavy atoms (such as In). Hence, the fine crystallite 133 includes an arrangement of metallic atoms having a periodicity in approximately five periods or more. When the crystal axis in the fine crystallite 133 coincides with the axis of the observation direction, bright spots are observed in the Fourier transformed image of the TEM image.

The InGaZnO film 130a of the semiconductor layer 130 can be approximated by a square (cube). Then, the size of a crystal with five periods can be estimated at approximately 1.5 nm. Thus, it is determined that the semiconductor layer 130 in the thin film transistors 10a and 10b where the annealing temperature Ta is 360° C. and 400° C. includes fine crystallites 133 having a size of 1.5 nm or more.

As shown in FIG. 7D, in the case where the annealing temperature Ta is 400° C., the image of fine crystallites 133 is observed relatively clearly. In the semiconductor layer 130, each region being substantially homogeneous therein corresponds to a fine crystallite 133. The size of the fine crystallite 133 can be estimated from the TEM image illustrated in FIG. 7D. Then, the size of the observed fine crystallite 133 is 5 nm or less.

In the TEM image, the square root of the area of the region being substantially homogeneous therein is defined as the particle diameter of the fine crystallite 133. Then, the average particle diameter was determined for the fine crystallites 133 having a particle diameter of 2 nm or more. That is, in the TEM image, the shape of the fine crystallite 133 having a size of 2 nm or more can be recognized relatively clear. Thus, the particle diameter is measured for such fine crystallites 133 having a size of 2 nm or more, and the average thereof is used as the average particle diameter of the fine crystallites 133. In the case where the annealing temperature Ta is 400° C., the average particle diameter of the fine crystallites 133 was 3.5 nm.

That is, in the range of the annealing temperature Ta of 300-400° C. corresponding to the embodiment, fine crystallites 133 having periodicity in the arrangement of atoms are formed in the semiconductor layer 130. The average particle diameter of the fine crystallites 133 is 3.5 nm or less.

Here, if the annealing temperature Ta is higher than 400° C., the average particle diameter of the fine crystallites 133 is made larger than that in the case where the annealing temperature Ta is 400° C. Then, among a plurality of fine crystallites 133, the average particle diameter of the fine crystallites 133 having a particle diameter of 2 nm or more is made larger than 3.5 nm.

Thus, in the case of low annealing temperature Ta (e.g., in the first temperature range TR1), the InGaZnO film 130a (semiconductor layer 130) is a film in the amorphous state or, even with a crystal structure (periodicity), a film including fine crystallites having a particle diameter of less than 1.5 nm.

In the case of high annealing temperature Ta (in the second temperature range TR2 and the third temperature range TR3), the crystal of the InGaZnO film 130a is grown so that the InGaZnO film 130a includes fine crystallites 133 having a particle diameter of 1.5 nm or more.

Thus, with the increase of the annealing temperature Ta, fine crystallites 133 are formed, and the particle diameter of the fine crystallites 133 is increased. This phenomenon is correlated with the characteristics of the thin film transistor. For instance, it is conjectured that at the temperature where the mobility μ sharply increases with the increase of the annealing temperature Ta, the formation of fine crystallites 133 is promoted, and the increase of the particle diameter of the fine crystallites 133 is promoted.

As described above, the mobility μ discontinuously and sharply increases when the annealing temperature Ta is increased from 280° C. to 300° C. The threshold voltage Vth discontinuously and sharply decreases when the annealing temperature Ta is increased from 250° C. to 280° C. Thus, it can be estimated that the promotion of the growth of fine crystallites 133 in the semiconductor layer 130 starts when the annealing temperature Ta is in the range from around 280° C. to 300° C.

When the annealing temperature Ta is in the second temperature range TR2 (300° C. or more and less than 400° C., and more particularly 300° C. or more and 380° C. or less), in the TEM image of the semiconductor layer 130, no lattice image is observed. In the Fourier transformed image of the TEM image, bright spots based on the periodicity of the fine crystallite 133 are observed. Thus, it can be determined that the semiconductor layer 130 includes fine crystallites 133.

When the annealing temperature Ta is relatively high (e.g., in the third temperature range TR3), in the TEM image of the semiconductor layer 130, a lattice image is observed. In the Fourier transformed image of the TEM image, clear diffraction pattern images based on the internal periodicity of the fine crystallite 133 are observed.

As illustrated in FIG. 4A, at an annealing temperature Ta of 300° C. or more, the mobility μ discontinuously and sharply increases from that in the lower first temperature range TR1. Hence, it can be determined that fine crystallites 133 exist at 300° C. or more. Furthermore, more reliably, it can be determined that fine crystallites 133 exist at an annealing temperature Ta of 320° C. or more.

Thus, the annealing temperature Ta is preferably 320° C. or more. This can increase the mobility μ.

That is, when the annealing temperature Ta is at least 320° C. or more and less than 400° C. in the second temperature range TR2, in the TEM image, no lattice image is observed in the semiconductor layer 130. However, in the Fourier transformed image of the TEM image, bright spots based on the periodicity of the fine crystallite 133 are observed. Thus, it can be determined that the semiconductor layer 130 includes fine crystallites 133.

Furthermore, as described above, in the case where the annealing temperature Ta is 400° C., although the mobility μ increases, the threshold voltage Vth significantly decreases and turns into negative polarity. The reason for this decrease of the threshold voltage Vth is conjectured as follows. As a result of the increase of the annealing temperature Ta, the fine crystallites 133 are made larger. Thus, oxygen vacancy occurs at the interfaces of the semiconductor layer 130 with the gate insulating film 120 and the channel protection layer 140 above and below the semiconductor layer 130. Oxygen vacancy also occurs at the grain boundary between the fine crystallites 133. Donor levels due to this oxygen vacancy result in the decrease of the threshold voltage Vth.

In the case of applying the thin film transistor to e.g. liquid crystal display devices and organic EL display devices, the mobility μ is preferably larger. However, under the restriction of circuit configuration, preferably, the threshold voltage Vth is approximately 0-3 V. In particular, in the case of using thin film transistors in driver circuits besides for switching the pixels of the display device, the threshold voltage Vth is preferably a positive value.

Thus, more preferably, the annealing temperature Ta is less than 400° C. (e.g., 380° C. or less). That is, the following condition is more preferable. Fine crystallites 133 in the semiconductor layer 130 are relatively small. In the TEM image, no lattice image is observed in the semiconductor layer 130. However, in the Fourier transformed image of the TEM image, bright spots based on the periodicity of the fine crystallite 133 are observed. Under this condition, among a plurality of fine crystallites 133, the average particle diameter of the fine crystallites 133 having a crystallite diameter of 2 nm or more is smaller than 3.5 nm.

Thus, the threshold voltage Vth can be set to a positive value. In the case of e.g. applying the thin film transistor to display devices and the like, the circuit configuration is simplified. Furthermore, the thin film transistor is also applicable to driver circuits besides pixels. This facilitates realizing a display device with higher degree of integration and higher reliability.

Solid-phase microcrystallization of the InGaZnO film 130a is related to the amount of oxygen content in the film. That is, if the amount of oxygen vacancy is large, microcrystallization starts from a low temperature. However, if the amount of oxygen vacancy is significantly large, the resistance of the film decreases. This makes it difficult to achieve good current-voltage characteristics.

In contrast, in the thin film transistors 10, 10a, and 10b according to the embodiment, the semiconductor layer 130 (InGaZnO film 130a) is covered with the channel protection layer 140 ($SiO_2$ film 140a), and annealing is performed in this state. This suppresses the significant oxygen desorption described above. Thus, formation of fine crystallites 133 having an appropriate particle diameter in the semiconductor layer 130 is made compatible with good current-voltage characteristics.

Furthermore, the operational reliability of the thin film transistor 10a according to the embodiment is described with reference to the comparative example.

Figure 9:
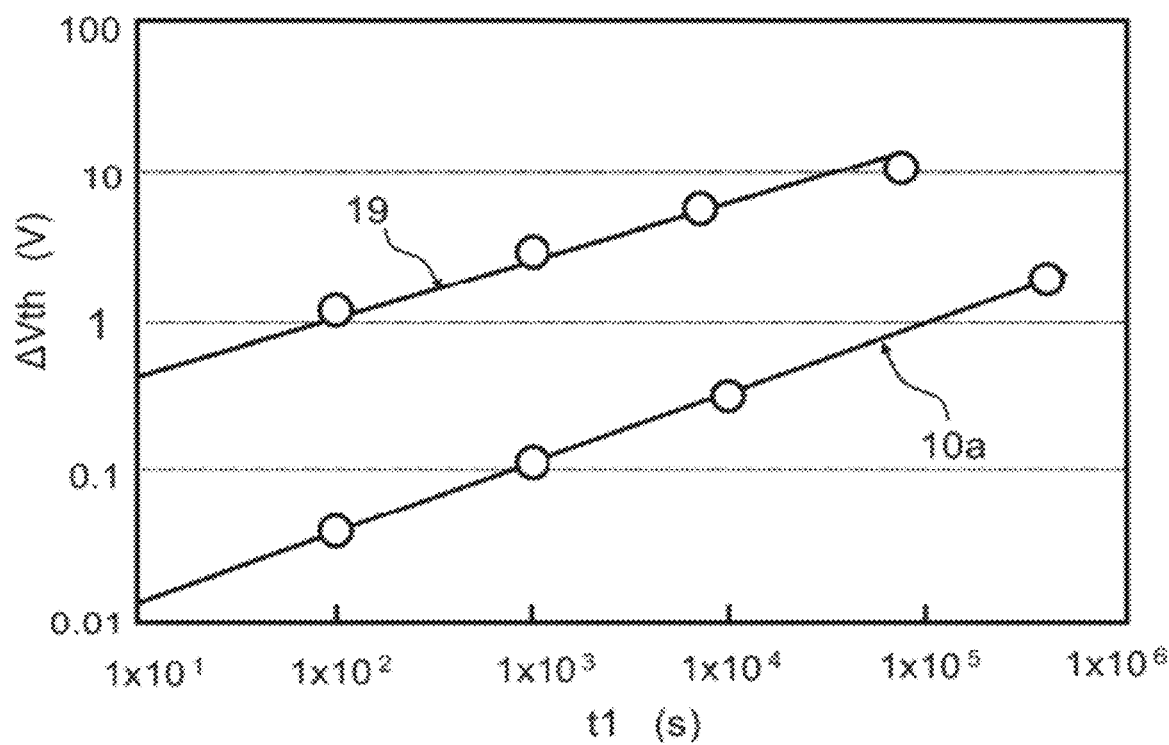
FIG. 9 is a graph illustrating the characteristics of the thin film transistor.

FIG. 9 is a graph illustrating the characteristics of the thin film transistor according to the first embodiment.

More specifically, this figure illustrates the result of an electrically bias stressed at increasing temperature life test for the thin film transistor 10a according to the embodiment and the thin film transistor 19 of the comparative example. This life test is a bias/temperature stress (BTS) test. At a temperature of 80° C., a voltage stress of Vg=15 V and Vd=0 V was continuously applied to the thin film transistor. The shift amount (threshold voltage shift ΔVth) from the initial value of the threshold voltage Vth of the thin film transistor was evaluated. In this figure, the horizontal axis represents the elapsed time t1 of bias application. The vertical axis represents the threshold voltage shift ΔVth.

As shown in FIG. 9, in the thin film transistor 19 of the comparative example where the annealing temperature Ta is 250° C., for an elapsed time t1 of 10000 seconds, the threshold voltage shift ΔVth is approximately 2.1 V. Thus, with the passage of time t1 of bias application, the threshold voltage Vth is shifted significantly. In contrast, in the thin film transistor 10a according to the embodiment including fine crystallites 133 where the annealing temperature Ta is 360° C., for an elapsed time t1 of 10000 seconds, the threshold voltage shift ΔVth is 0.33 V, which is very small.

Thus, the thin film transistor according to the embodiment exhibited a good result in the BTS test. The reason for this is considered as follows. By using an appropriate annealing temperature Ta, fine crystallites 133 are formed in the semiconductor layer 130. Thus, the semiconductor layer 130 is turned from the amorphous state into the crystallized state. This has improved the tolerance to voltage stress.

The dispersed state of fine crystallites 133 in the semiconductor layer 130 is now described.

FIGS. 10A to 10D are schematic views illustrating the configuration of the semiconductor layer in the thin film transistor.

Figure 10A:
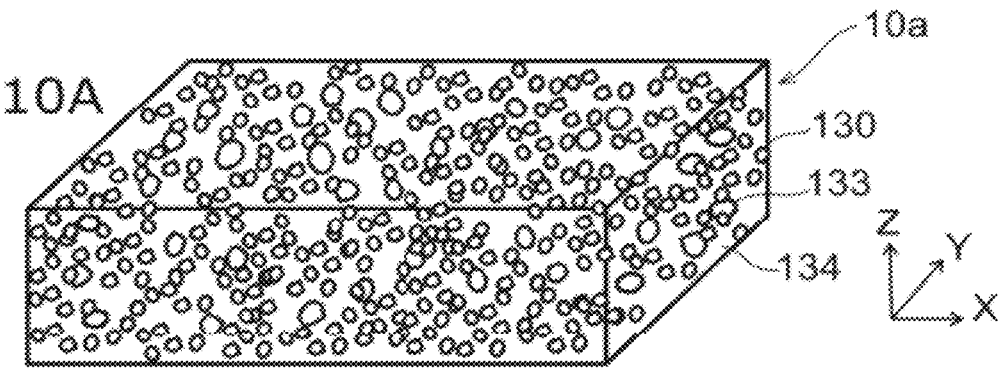
FIGS. 10A to 10D are schematic views illustrating the configuration of the semiconductor layer.
Figure 10B:
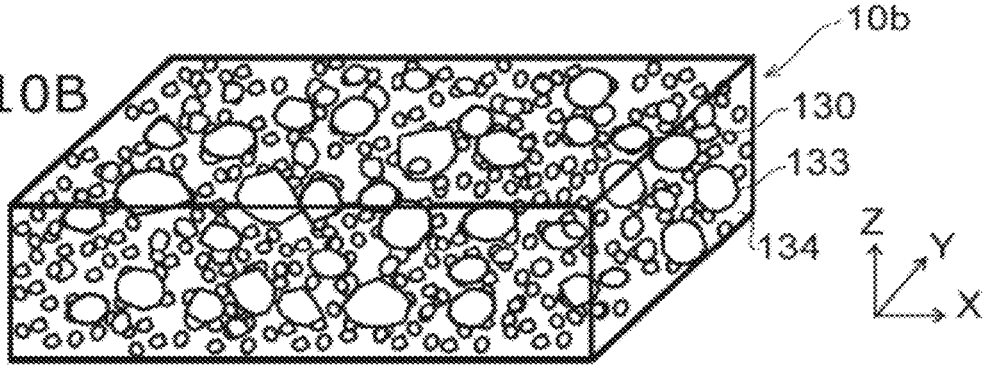
Figure 10C:
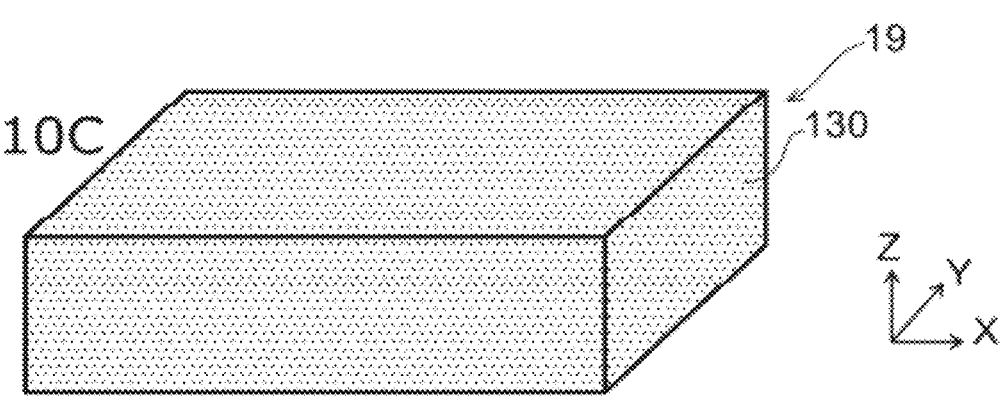
Figure 10D:
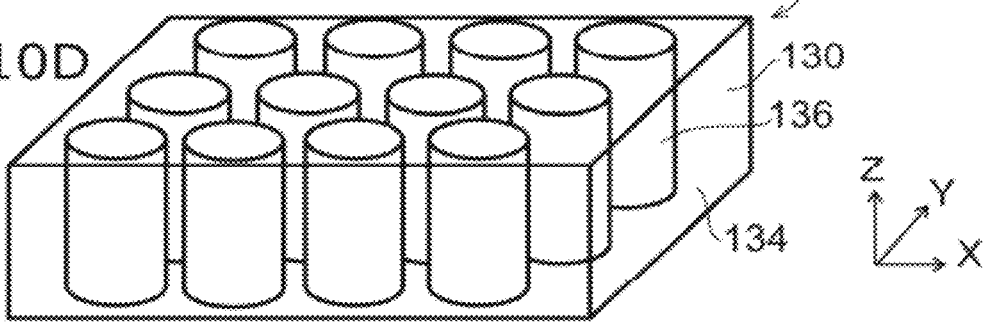

More specifically, FIGS. 10A, 10B, and 10C illustrate a model of the configuration of the semiconductor layer 130 in the above thin film transistors 10a, 10b, and 19, respectively. FIG. 10D illustrates a model of the configuration of the semiconductor layer 130 in a thin film transistor 19a of an alternative comparative example.

As shown in FIG. 10A, in the semiconductor layer 130 of the thin film transistor 10a according to the embodiment where the annealing temperature Ta is 360° C., fine crystallites 133 having a small particle diameter are dispersed in the X-, Y-, and Z-axis directions. The number of fine crystallites 133 having a particle diameter exceeding 2 nm is very small (the average particle diameter of those having a particle diameter of 2 nm or more is smaller than 3.5 nm). Here, the region 134 around the fine crystallites 133 is a collection of fine crystallites having a particle diameter of primarily 1.5-2 nm. Part of this region may be in the amorphous state.

As shown in FIG. 10B, in the semiconductor layer 130 of the thin film transistor 10b according to the embodiment where the annealing temperature Ta is 400° C., fine crystallites 133 having a large particle diameter are dispersed in the X-, Y-, and Z-axis directions. The average particle diameter of the fine crystallites 133 is 3.5 nm. Here, also in this case, the region 134 around the fine crystallites 133 is a collection of fine crystallites having a particle diameter of primarily 1.5-2 nm. Part of this region may be in the amorphous state.

In the thin film transistors 10a and 10b according to the embodiment, fine crystallites 133 are dispersed three-dimensionally in the semiconductor layer 130. Thus, the desired current-voltage characteristics can be achieved. Hence, a thin film transistor having high mobility and good characteristics can be realized.

As shown in FIG. 10C, in the semiconductor layer 130 of the thin film transistor 19 of the comparative example where the annealing temperature Ta is 250° C., no fine crystallite 133 is formed. The semiconductor layer 130 is entirely in the amorphous state. Thus, the mobility μ is low.

As shown in FIG. 10D, in the semiconductor layer 130 of the thin film transistor 19a of the alternative comparative example, columnar crystal grains 136 are formed. The columnar crystal grains 136 are grown e.g. from the gate insulating film 120 underlying the semiconductor layer 130 toward the inside of the semiconductor layer 130. Such columnar crystal grains 136 are formed in the case where the metal oxide of the semiconductor layer 130 is crystal-grown at high temperature by sputtering method relatively easily. Such crystal grains 136 have an axis parallel to the Z-axis direction. The crystal grains 136 are arranged two-dimensionally in the X-Y plane, and not dispersed three-dimensionally in the semiconductor layer 130. Thus, for instance, the resistance is excessively low in the Z-axis direction, a large quantity of defects are easy to occur between crystal grains. Hence, the desired current-voltage characteristics cannot be achieved.

Thus, in the thin film transistor according to the embodiment, the semiconductor layer 130 preferably includes a plurality of fine crystallites 133 dispersed three-dimensionally in the semiconductor layer 130 and having periodicity in the arrangement of atoms.

In the thin film transistor based on the InGaZnO film 130a, for instance, after the source electrode 181 and the drain electrode 182 are formed, annealing is performed at a high temperature of 300° C. or more. Then, oxygen may migrate from the InGaZnO film 130a toward the source electrode 181 and the drain electrode 182.

For instance, also in the case where a Mo film or Ti film is used as a barrier metal for the source electrode 181 and the drain electrode 182, oxygen migrates from the InGaZnO film 130a toward the source electrode 181 and the drain electrode 182. Thus, the current-voltage characteristics of the thin film transistor may exhibit characteristics degradation such as negative shift of the threshold voltage Vth.

Hence, the above annealing treatment for forming fine crystallites 133 in the semiconductor layer 130 is preferably performed in the state in which the InGaZnO film 130a is not in contact with the source electrode 181 and the drain electrode 182.

That is, as described with reference to FIGS. 2C to 2E, the annealing treatment for forming fine crystallites 133 in the InGaZnO film 130a (the treatment illustrated in FIG. 2C) is preferably performed before the formation of the film constituting the source electrode 181 and the drain electrode 182 (the step illustrated in FIG. 2E).

Figure 11A:
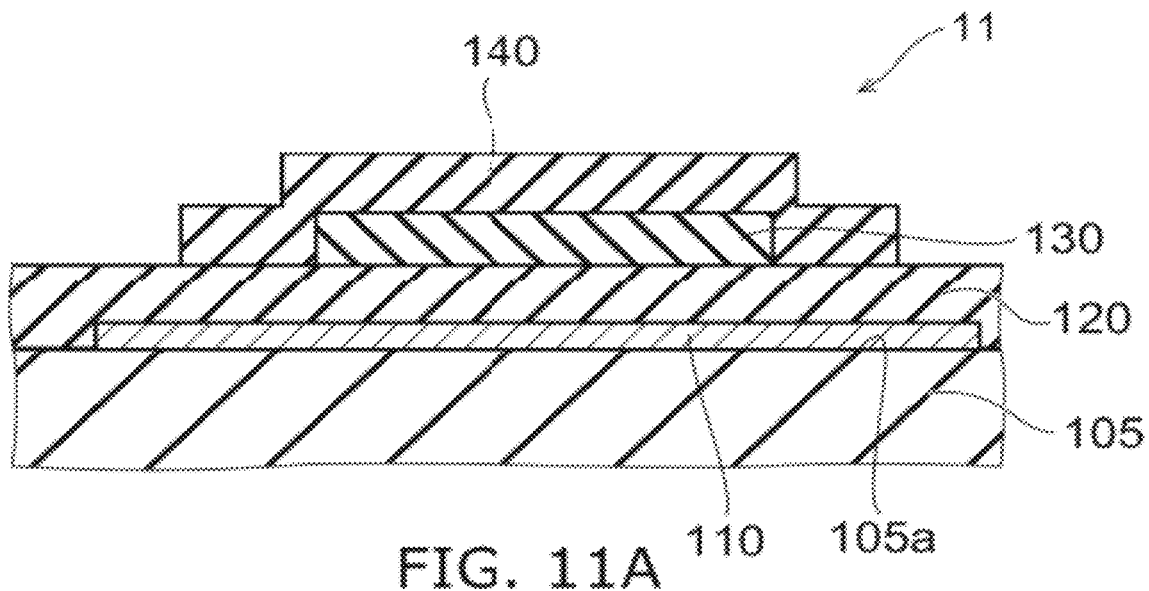
FIGS. 11A and 11B are schematic views illustrating a thin film transistor.
Figure 11B:
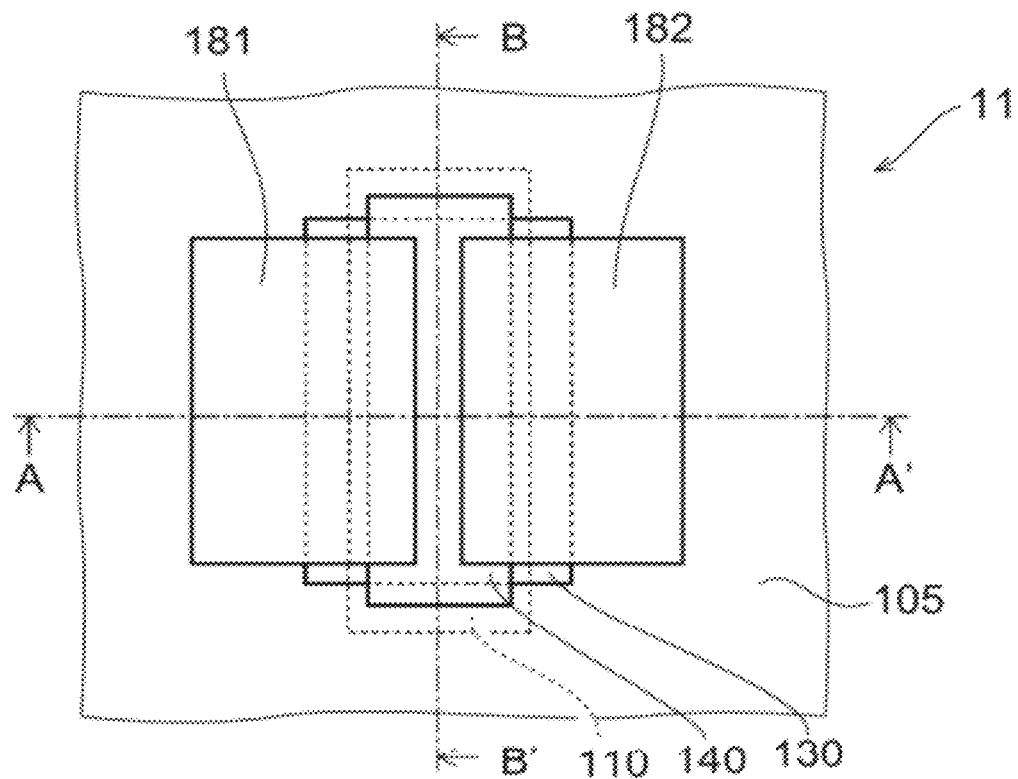

FIGS. 11A and 11B are schematic views illustrating the configuration of an alternative thin film transistor according to the first embodiment.

More specifically, FIG. 11B is a schematic plan view, and FIG. 11A is a sectional view taken along line B-B' of FIG. 11B.

As shown in FIGS. 11A and 11B, the alternative thin film transistor 11 according to the embodiment also includes a gate electrode 110, a semiconductor layer 130 provided facing the gate electrode 110, a gate insulating film 120 provided between the gate electrode 110 and the semiconductor layer 130, and a source electrode 181 and a drain electrode 182 electrically connected to the semiconductor layer 130 and spaced from each other.

The semiconductor layer 130 includes an oxide including at least one of gallium and zinc, and indium. The semiconductor layer 130 includes a plurality of fine crystallites dispersed three-dimensionally in the semiconductor layer 130 and having periodicity in the arrangement of atoms.

In the thin film transistor 11, the planar pattern shape of the channel protection layer 140 as viewed in the Z-axis direction is a pattern shape covering the edge of the semiconductor layer 130 traversing on the gate electrode 110. That is, the channel protection layer 140 covers the edge in the Y-axis direction of the semiconductor layer 130.

The thin film transistor 11 thus configured can be manufactured by partially modifying the method for manufacturing the thin film transistor 10 described above.

FIGS. 12A to 12E are sequential schematic sectional views illustrating a method for manufacturing an alternative thin film transistor according to the first embodiment.

In these figures, the left portion corresponds to the TFT region TFR, and the right portion corresponds to the connecting portion region CPR.

Figure 12A:
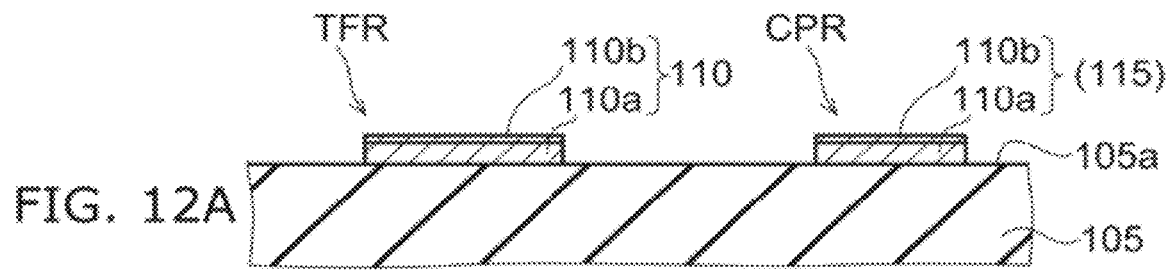
FIGS. 12A to 12E are sequential schematic sectional views illustrating a method for manufacturing a thin film transistor.

First, as shown in FIG. 12A, similarly to the method described with reference to FIG. 2A, on the major surface 105a of a substrate 105, an Al film 110a and a Mo film 110b constituting a gate electrode 110 are formed and processed into a prescribed pattern shape. Also in the connecting portion region CPR, an Al film 110a and a Mo film 110b constituting part of a connecting portion 115 are processed into a prescribed pattern shape.

Figure 12B:
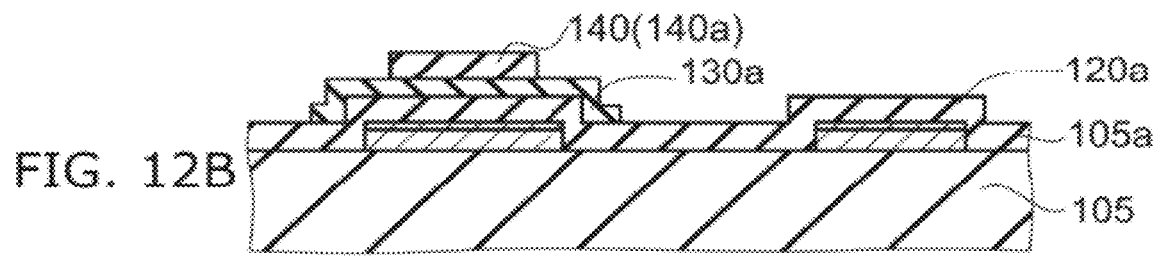

Next, as shown in FIG. 12B, similarly to that described with reference to FIG. 2B, a $SiO_2$ film 120a constituting a gate insulating film 120 is formed. The film formation temperature at this time is preferably e.g. 300° C. or more. Furthermore, on the $SiO_2$ film 120a, an InGaZnO film 130a constituting a semiconductor layer 130 is formed to a thickness of e.g. 20 nm.

Then, by photolithography and etching, the InGaZnO film 130a is processed into a prescribed pattern shape. Here, as the etching liquid, dilute oxalic acid can be used.

Furthermore, a $SiO_2$ film 140a constituting a channel protection layer 140 is formed by e.g. the PE-CVD method with $SiH_4$ and $N_2O$ to a thickness of e.g. 200 nm. At this time, the substrate temperature during film formation is set to 270° C. Next, the $SiO_2$ film 140a is processed into a prescribed pattern shape. Here, the pattern shape of the channel protection layer 140 is set to a pattern shape covering the edge (the edge in the Y-axis direction) of the InGaZnO film 130a traversing on the gate electrode 110. Here, in the case where the substrate 105 is light transmissive, the processing of the $SiO_2$ film 140a can be performed by using a combination of back surface exposure and mask exposure. For the etching of this step, RIE with $CF_4$ can be used.

Figure 12C:
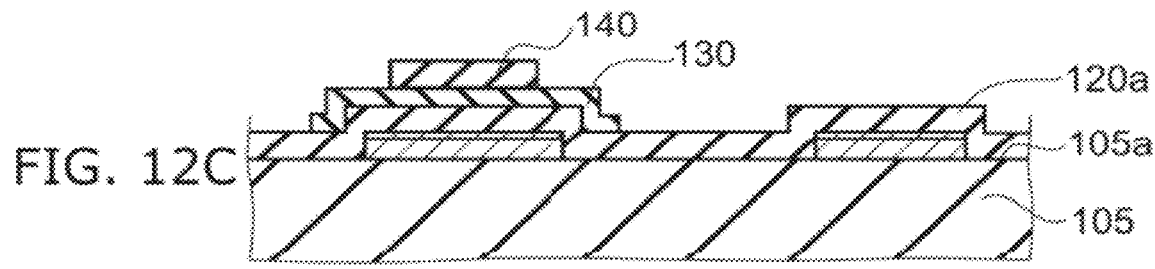

Next, as shown in FIG. 12C, in an annealing furnace with a nitrogen atmosphere, the workpiece is held for one hour at an annealing temperature Ta of e.g. 340° C. to perform annealing treatment. Thus, fine crystallites 133 are formed in the InGaZnO film 130a in the amorphous state.

Figure 12D:
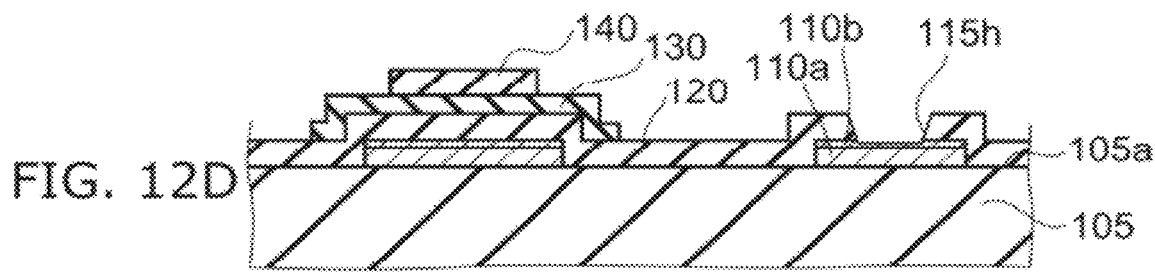

Next, as shown in FIG. 12D, by a method similar to the method described with reference to FIG. 2D, in the connecting portion region CPR, the semiconductor layer 130 and the gate insulating film 120 ($SiO_2$ film 120a) are selectively removed to form a contact hole 115h for forming a connecting portion 115. In the etching of the $SiO_2$ film 120a, for instance, buffered hydrofluoric acid can be used.

Figure 12E:
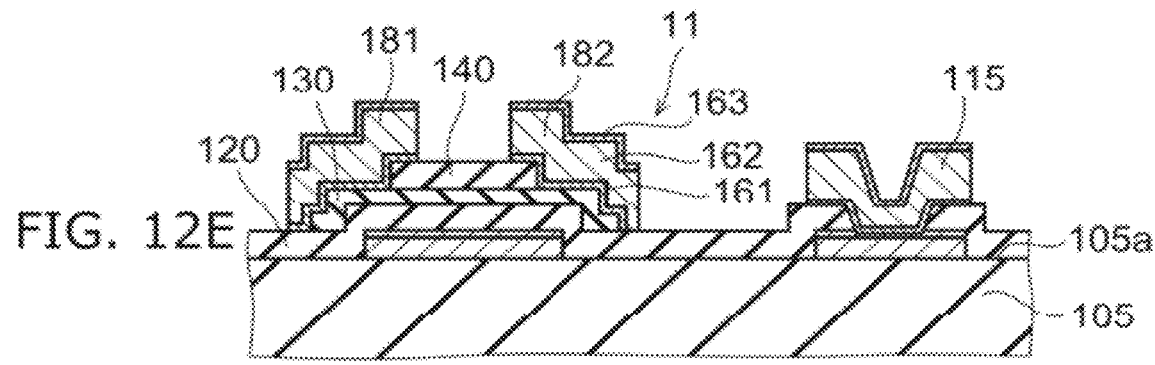

Next, as shown in FIG. 12E, by a method similar to the method described with reference to FIG. 2E, a source electrode 181 and a drain electrode 182 are formed.

Next, for instance, a $SiO_2$ film is formed as a passivation film. Further thereon, a SiN film is formed. Then, an opening for electrode extraction is formed. Furthermore, to remove damage during the process, for instance, a damage removal treatment for approximately one hour at 260° C. is performed. Thus, the thin film transistor 11 illustrated in FIGS. 11A and 11B is completed. This damage removal treatment can be performed in nitrogen.

The thin film transistor 11 can achieve high mobility because the semiconductor layer 130 includes fine crystallites 133.

Here, for instance, on the above passivation film, a pixel electrode connected to the drain electrode 182 can be formed. Thus, an active matrix substrate for TFT-LCD is fabricated. Alternatively, on the passivation film, a transparent resin layer or color filter layer (colored layer) may be formed, and a pixel electrode may be formed thereon.

Here, if the thin film transistor of an active matrix substrate for TFT-LCD using the InGaZnO film 130a for the semiconductor layer 130 is operated while being irradiated with light having a wavelength around 400 nm, characteristics degradation may occur.

However, in the thin film transistors 10, 10a, 10b, and 11 according to the embodiment, fine crystallites 133 are formed in the InGaZnO film 130a. This significantly improves the characteristics degradation in the operation while being irradiated with light having a wavelength around 400 nm.

Furthermore, to suppress this degradation, a configuration for reducing the amount of light irradiation of the thin film transistor can be adopted. More specifically, in the configuration of the thin film transistors 10, 10a, 10b, and 11, the gate electrode 110 serves as a light shielding film for light from the substrate 105 side. Hence, a light shielding layer is preferably provided on the upper side (on the opposite side from the substrate 105) of the semiconductor layer 130.

In the case of providing a color filter layer on the active matrix substrate, the G (green) color filter layer has lower transmittance for light around 400 nm. Hence, irrespective of the color of the pixel, a green color filter layer is preferably provided on the thin film transistor. This configuration is described later.

The above thin film transistors 10, 10a, 10b, and 11 are thin film transistors of the bottom gate structure. That is, the gate electrode 110 is provided on the major surface 105a of the substrate 105. The semiconductor layer 130 is provided on the opposite side of the gate electrode 110 from the substrate 105.

In the case where the channel protection layer 140 is provided, the channel protection layer 140 is provided on the opposite side of the semiconductor layer 130 from the gate electrode 110.

However, the embodiment is not limited thereto, but may be based on the top gate structure.

Second Embodiment

The thin film transistor according to the embodiment has the top gate structure.

Figure 13A:
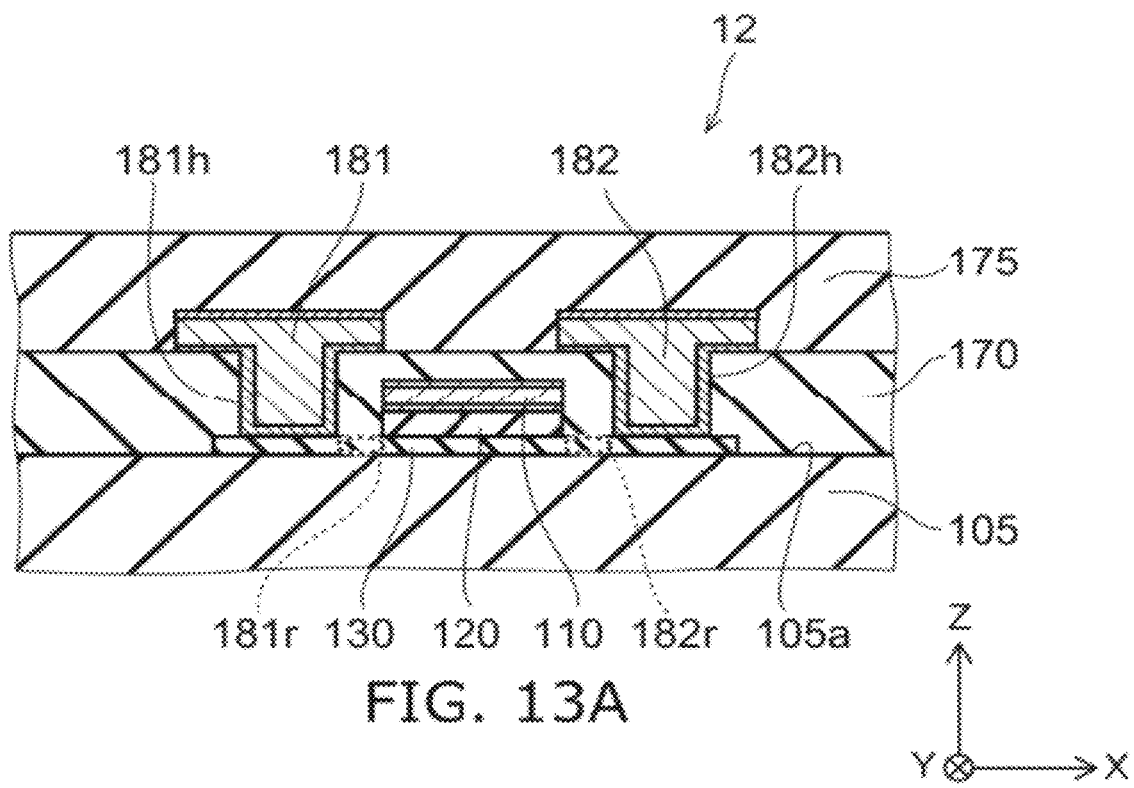
FIGS. 13A and 13B are schematic views illustrating a thin film transistor.
Figure 13B:
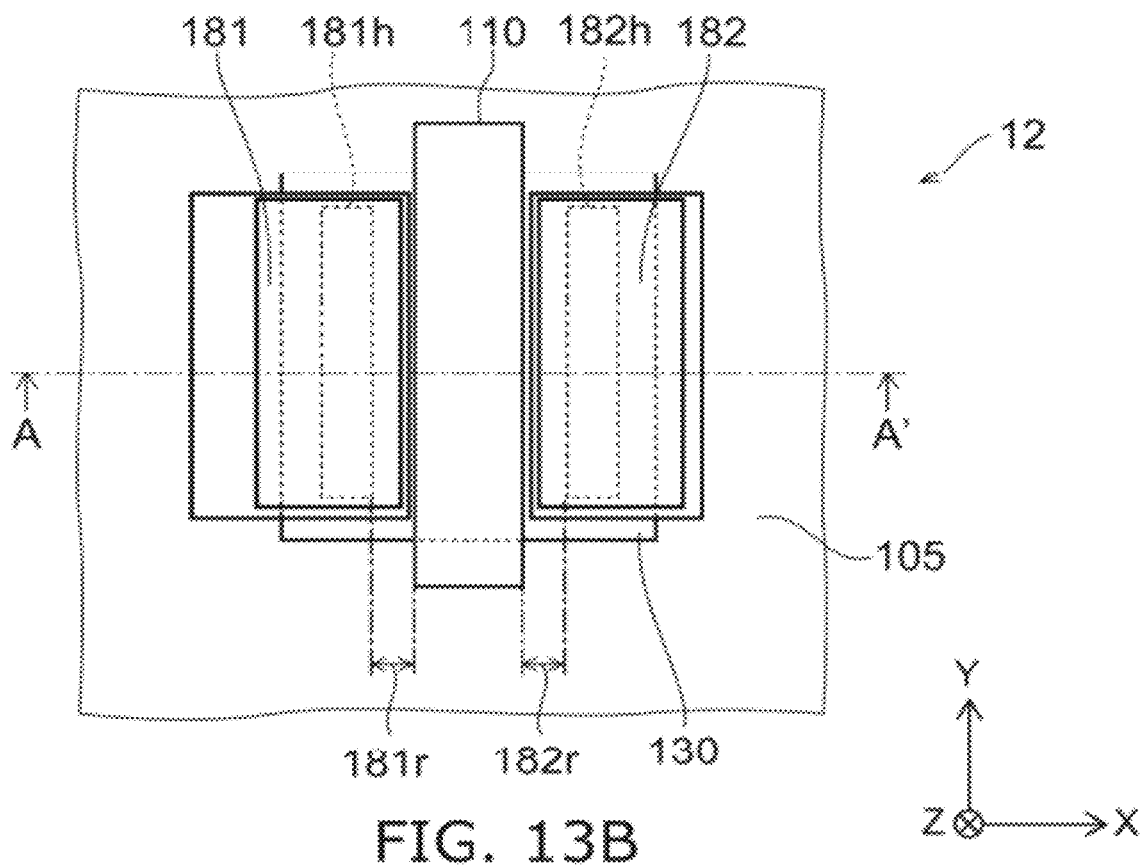

FIGS. 13A and 13B are schematic views illustrating the configuration of an alternative thin film transistor according to a second embodiment.

More specifically, FIG. 13B is a schematic plan view, and FIG. 13A is a sectional view taken along line A-A' of FIG. 13B.

As shown in FIGS. 13A and 13B, the thin film transistor 12 according to the second embodiment also includes a gate electrode 110, a semiconductor layer 130 provided facing the gate electrode 110, a gate insulating film 120 provided between the gate electrode 110 and the semiconductor layer 130, and a source electrode 181 and a drain electrode 182 electrically connected to the semiconductor layer 130 and spaced from each other.

In this case, the semiconductor layer 130 is provided on the major surface 105a of a substrate 105. The gate electrode 110 is provided on the opposite side of the semiconductor layer 130 from the substrate 105. That is, the semiconductor layer 130, the gate insulating film 120, and the gate electrode 110 are provided in this order on the major surface 105a of the substrate 105.

Here, also in the substrate 105 in this case, the surface of the portion where the semiconductor layer 130 is provided is insulative.

The semiconductor layer 130, the insulating film 120, and the gate electrode 110 are covered with an interlayer insulating film 170. In part of the interlayer insulating film 170, through holes 181h and 182h communicating with the semiconductor layer 130 are provided. A conductive material is embedded therein to form a source electrode 181 and a drain electrode 182. In this example, further thereon, a passivation film 175 is provided. This can improve the reliability by suppressing the external influence of moisture and the like.

Also in this case, the semiconductor layer 130 includes an oxide including at least one of gallium and zinc, and indium. The semiconductor layer 130 includes a plurality of fine crystallites dispersed three-dimensionally in the semiconductor layer 130 and having periodicity in the arrangement of atoms.

In the semiconductor layer 130 (InGaZnO film 130a) of the region 181r between the through hole 181h and the gate electrode 110, and the semiconductor layer 130 of the region 182r between the through hole 182h and the gate electrode 110, the electrical resistance is set lower than in the other portion of the semiconductor layer 130. Thus, the desired current can be passed between the source electrode 181 and the drain electrode 182 on one hand and the gate electrode 110 on the other. This facilitates realizing the desired operation.

FIGS. 14A to 14E are sequential schematic sectional views illustrating a method for manufacturing a thin film transistor according to the second embodiment.

In these figures, the left portion corresponds to the TFT region TFR, and the right portion corresponds to the connecting portion region CPR.

Figure 14A:
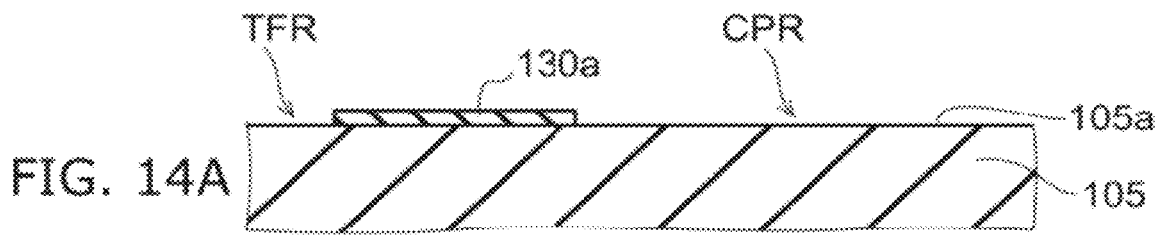
FIGS. 14A to 14E are sequential schematic sectional views illustrating a method for manufacturing a thin film transistor.

First, as shown in FIG. 14A, on the major surface 105a of a substrate 105 made of glass, an InGaZnO film 130a constituting a semiconductor layer 130 is formed to a thickness of 20 nm by e.g. the reactive DC sputtering method, and processed into a prescribed pattern shape.

Here, on the major surface 105a of the substrate 105, a thin barrier undercoat film, not shown, may be formed, and an InGaZnO film 130a may be formed thereon. Film formation of the InGaZnO film 130a on the flat substrate 105 or on the flat thin barrier undercoat film facilitates obtaining the InGaZnO film 130a with good quality.

Figure 14B:
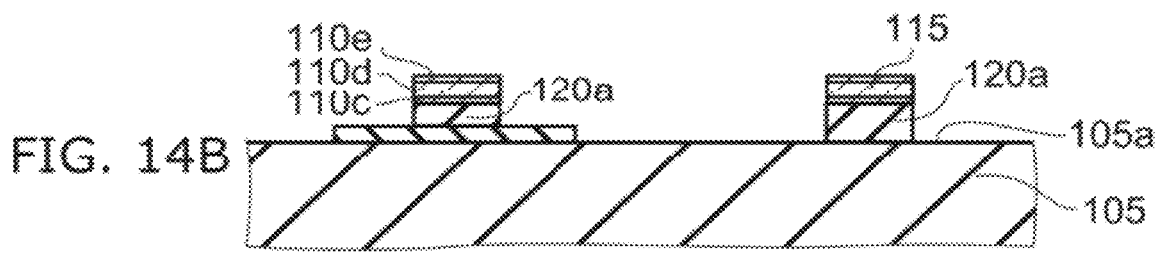

Next, as shown in FIG. 14B, a $SiO_2$ film 120a constituting a gate insulating film 120 is formed to a thickness of 100 nm by e.g. the PE-CVD method with $SiH_4$ and $N_2O$.

At this time, to improve the electrical stability of the gate insulating film 120 and to enhance the gate voltage stress tolerance of TFT, the film formation temperature of the $SiO_2$ film 120a constituting the gate insulating film 120 is preferably made as high as possible. However, by exposure of the InGaZnO film 130a to high temperature, desorption of surface oxygen occurs and decreases the resistance of the InGaZnO film 130a. Thus, an effective method for the film formation of the $SiO_2$ film 120a is to increase the substrate temperature in $N_2O$ plasma of the film formation chamber and to gradually supply $SiH_4$ gas into the $N_2O$ plasma. In particular, in the early phase of the film formation of the $SiO_2$ film 120a, the gas flow rate ratio of $SiH_4/N_2O$ is set to 1/100 or less. Then, even if the film formation temperature of $SiO_2$ is increased to 350° C., the resistance decrease of the InGaZnO film 130a can be prevented. Thus, a gate insulating film 120 with high reliability can be formed.

Depending on the film formation temperature of the $SiO_2$ film 120a constituting the gate insulating film 120, crystallization of the InGaZnO film 130a can be advanced during the film formation of the $SiO_2$ film 120a to form fine crystallites 133 in the InGaZnO film 130a. However, the film formation temperature of the $SiO_2$ film 120a is often insufficient for forming fine crystallites 133. Thus, to obtain the thin film transistor 12 with desired characteristics by forming desired fine crystallites 133 more stably, it is preferable to perform an annealing treatment for holding the workpiece for one hour at e.g. 340° C. in an annealing furnace with an ambient atmosphere. Then, fine crystallites 133 can be formed more stably in the InGaZnO film 130a.

Next, a Ti film 110c, an Al film 110d, and a Ti film 110e constituting a gate electrode 110 are formed by sputtering to a thickness of 30 nm, 150 nm, and 30 nm, respectively. Then, the gate electrode 110 and the gate insulating film 120 are processed into a prescribed pattern shape.

This patterning can be performed by using the following method. The gate electrode 110 is patterned into a prescribed pattern shape by reactive dry etching with chlorine and boron trichloride. Then, by switching the gas to $C_4F_8$, the gate insulating film 120 is continuously etched in the same pattern shape. Thus, the gate insulating film 120 is patterned.

Figure 14C:
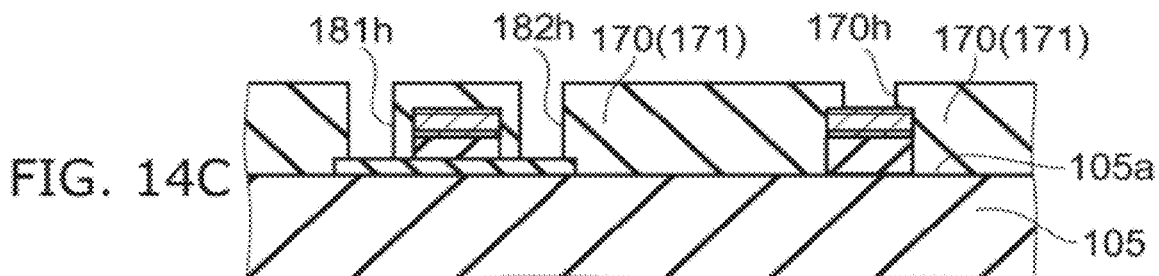

Next, as shown in FIG. 14C, as an interlayer insulating film 170, a $SiO_2$ film 171 is formed to a thickness of 350 nm by e.g. the PE-CVD method with TEOS.

At this time, the film formation temperature of the $SiO_2$ film 171 can be set to e.g. 230° C. This can decrease the electrical resistance of the region 181r between the through hole 181h and the gate electrode 110 and the region 182r between the through hole 182h and the gate electrode 110. The gas ratio of TEOS to oxygen at this time is 7:500.

Alternatively, the $SiO_2$ film 171 may be deposited by the PE-CVD method with $SiH_4$ and $N_2O$. In this case, the gas ratio of $SiH_4$ to $N_2O$ is e.g. 5:300.

Next, by photolithography, above the InGaZnO film 130a, through holes 181h and 182h for a source electrode 181 and a drain electrode 182 are formed. For this processing, for instance, reactive ion etching with $CHF_3$ can be used. At this time, in the connecting portion region CPR, a contact hole 170h communicating with the connecting portion 115 is formed in the interlayer insulating film 170 ($SiO_2$ film 171).

Figure 14D:
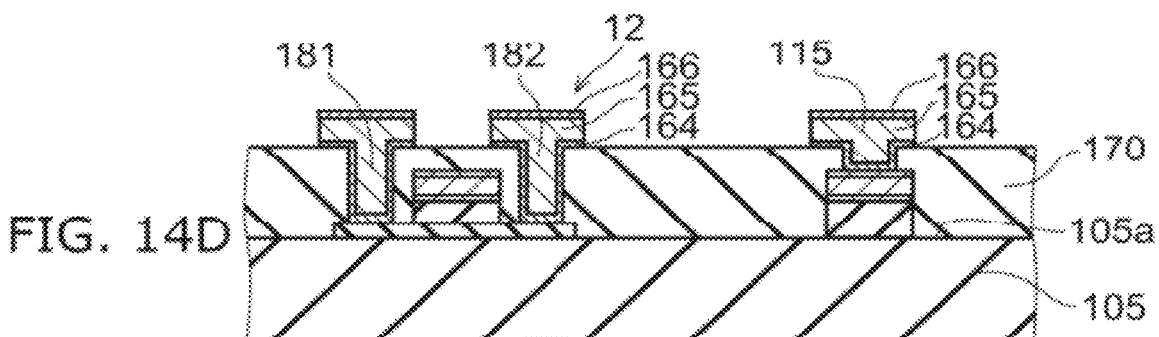

Next, as shown in FIG. 14D, a Ti film 164, an Al film 165, and a Ti film 166 constituting a source electrode 181 and a drain electrode 182 are formed to a film thickness of 30 nm, 200 nm, and 30 nm, respectively. This stacked film is embedded inside the through holes 181h and 182h and the contact hole 170h. Then, this stacked film is processed into a prescribed pattern shape. In this processing, similarly to the processing of the gate electrode 110, reactive dry etching with chlorine and boron trichloride can be used.

Figure 14E:
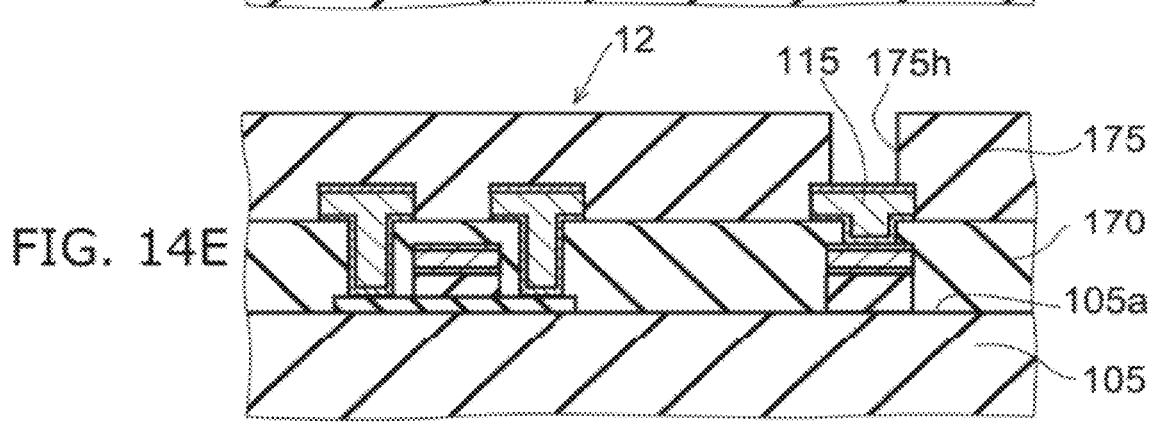

Further thereon, as shown in FIG. 14E, a SiN film constituting a passivation film 175 is formed by PE-CVD to a thickness of e.g. 200 nm. Then, an opening 175 for e.g. electrode extraction is formed. Next, to remove device damage during the process, a damage removal treatment for approximately one hour at 260° C. is performed in a nitrogen atmosphere. Thus, the thin film transistor 12 illustrated in FIGS. 13A and 13B can be fabricated.

In the thin film transistor 12, the semiconductor layer 130 includes a plurality of fine crystallites 133 dispersed three-dimensionally in the semiconductor layer 130 and having periodicity in the arrangement of atoms. Thus, high mobility can be realized. Furthermore, the top gate structure is adopted. Furthermore, the passivation film 175 is provided. Thus, the semiconductor layer 130 is effectively protected. Hence, the long-term reliability can be improved.

The SiN film used for the passivation film 175 has the property that the film containing a relatively larger amount of hydrogen has higher water blocking capability. To improve the water blocking capability, a SiN film containing a relatively large amount of hydrogen can be used for the passivation film 175. In this case, for instance, by annealing for removing device damage due to ultraviolet radiation and the like, hydrogen in the passivation film 175 may diffuse into the channel portion (semiconductor layer 130) below the gate electrode 110. This may decrease the threshold voltage Vth of the thin film transistor 12. However, in this case, as in the thin film transistor 12 according to the embodiment, the gate electrode 110 can be based on the configuration in which the Ti film 164, the Al film 165, and the Ti film 166 are inserted. This configuration is highly effective in suppressing the diffusion of hydrogen. Thus, this decrease of the threshold voltage Vth can be suppressed.

Third Embodiment

The third embodiment relates to an active matrix display device based on the thin film transistor according to the embodiments described above. In the following, as an example, an active matrix liquid crystal display device based on the thin film transistor 10 according to the first embodiment is described.

Figure 15A:
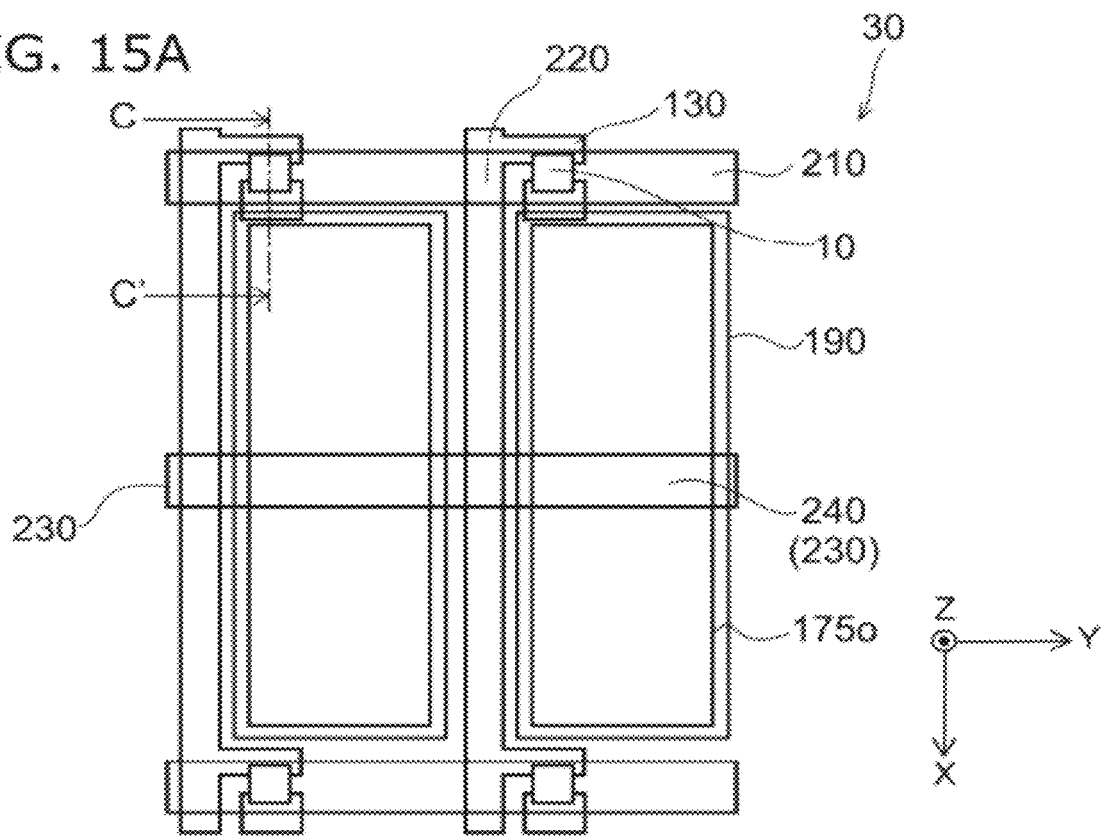
FIGS. 15A and 15B are schematic views illustrating an active matrix display device.
Figure 15B:
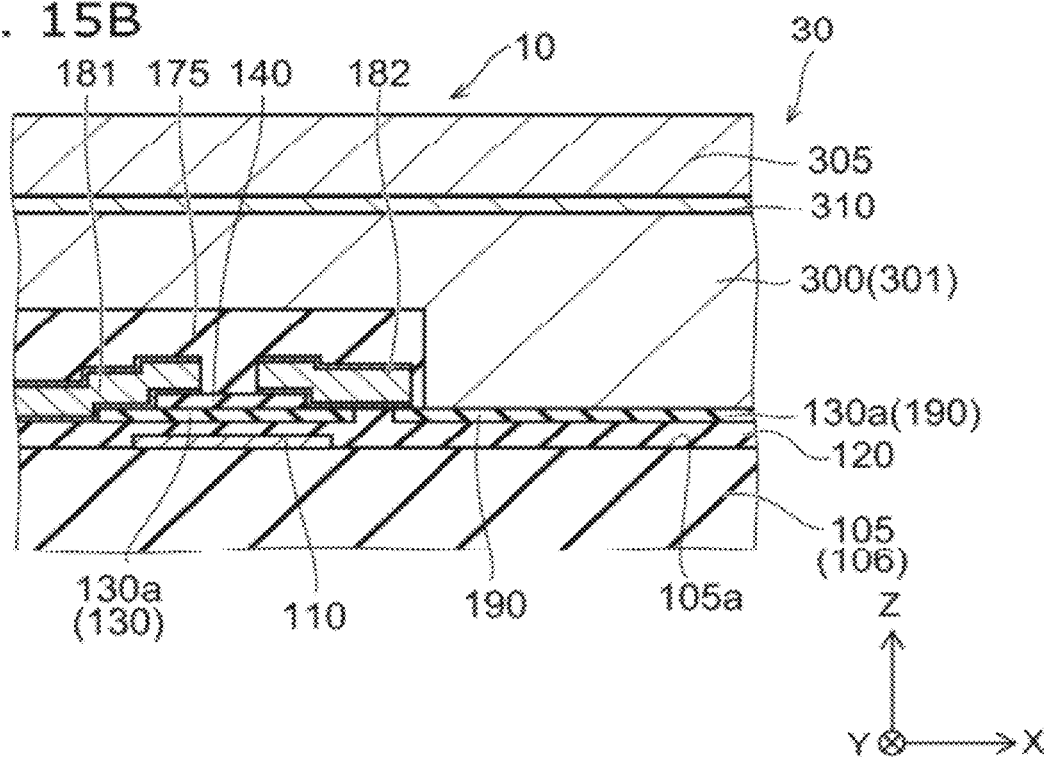

FIGS. 15A and 15B are schematic views illustrating the main configuration of an active matrix display device according to the third embodiment.

More specifically, FIG. 15A is a schematic plan view illustrating the configuration of two pixels of the active matrix display device 30 according to the embodiment. FIG. 15B is a sectional view taken along line C-C' of FIG. 15A. Here, the illustration of FIG. 15B is enlarged relative to FIG. 15A.

As shown in FIGS. 15A and 15B, the active matrix display device 30 includes a plurality of thin film transistors 10 arranged in a matrix configuration, a scan line 210 connected to the gate electrode 110 of each thin film transistor 10, a signal line 220 connected to the source electrode 181 of each thin film transistor 10, a pixel electrode 190 connected to the drain electrode 182 of each thin film transistor 10, and an optical element 300 (in this case, a liquid crystal layer 301) changing its optical characteristics in response to an electrical signal applied to the pixel electrode 190.

The liquid crystal layer 301 is provided between the pixel electrode 190 and the opposed electrode 310 of an opposed substrate 305 provided facing the pixel electrode 190.

That is, a thin film transistor 10, a scan line 210, a signal line 220, and a pixel electrode 190 are provided on the major surface 105a of an active matrix substrate 106 (substrate 105). Facing the active matrix substrate 106, an opposed substrate 305 including an opposed electrode 310 is placed. A liquid crystal layer 301 is provided between the pixel electrode 190 and the opposed electrode 310.

In the foregoing, the source electrode 181 and the drain electrode 182 may be interchanged.

The active matrix display device 30 illustrated in FIGS. 15A and 15B further includes a storage capacitor line 230 provided parallel to the scan line 210, and a storage capacitor electrode 240 connected to the storage capacitor line 230.

On the thin film transistor 10, a passivation film 175 is provided. In the passivation film 175, a pixel opening 175o is provided. In the pixel opening 175o, the pixel electrode 190 is exposed. Here, in FIG. 15A, the passivation film 175 is omitted, and the pixel opening 175o of the passivation film 175 is shown by a solid line.

The pixel electrode 190 is made of a film obtained by decreasing the resistance of the InGaZnO film 130a constituting the semiconductor layer 130.

Although not shown, for instance, an alignment layer for the liquid crystal layer 301 is provided on the surface of the pixel electrode 190 and the opposed electrode 310. Furthermore, two polarizing plates are provided so as to sandwich the active matrix substrate 106 and the opposed substrate 305. As necessary, a phase difference plate is provided between the polarizing plate and each of the active matrix substrate 106 and the opposed substrate 305. Furthermore, as necessary, a back light can be provided.

The optical element 300 is not limited to the liquid crystal layer 301. For instance, the optical element 300 may be an element emitting light in response to an electrical signal, such as an organic EL layer. That is, the optical element 300 performs at least one of changing its optical characteristics and emitting light in response to an electrical signal.

Figure 16:
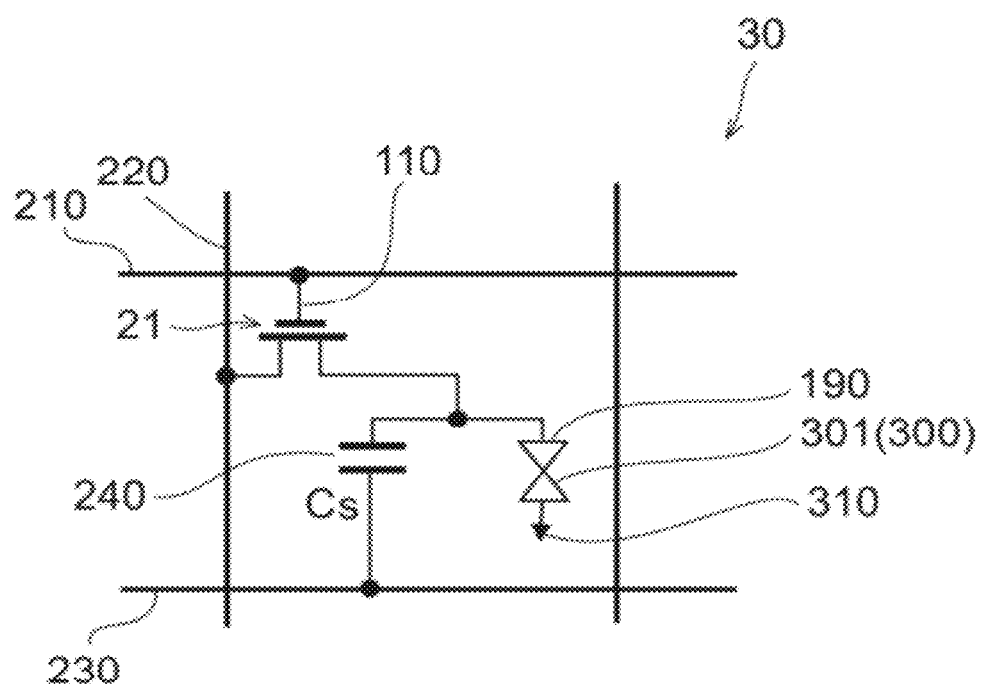
FIG. 16 is a circuit diagram illustrating an equivalent circuit of the active matrix display device.

FIG. 16 is a circuit diagram illustrating an equivalent circuit of the active matrix display device according to the third embodiment.

As shown in FIG. 16, in one unit of the active matrix display device 30 according to the third embodiment, the liquid crystal layer 301 serving as an optical element 300 is an electrical load sandwiched between the pixel electrode 190 and the opposed electrode 310. The electrical load is connected in parallel with the storage capacitance Cs formed by the storage capacitor electrode 240. These are connected to the signal line 220 through the thin film transistor 10. By the scan line 210, the gate electrode 110 of the thin film transistor 10 is sequentially turned on/off to write a desired charge to the liquid crystal layer 301. Thus, the active matrix display device 30 performs display operation.

In the active matrix display device 30, the semiconductor layer 130 of the thin film transistor 10 includes fine crystallites 133. Hence, the active matrix display device 30 has high current driving performance and can realize high display performance. Furthermore, the passivation film 175 is provided. Hence, the long-term reliability is high.

In the foregoing description, the thin film transistor 10 is used as an example. However, any of the thin film transistors according to the embodiments and the variations thereof can be used.

Figure 17A:
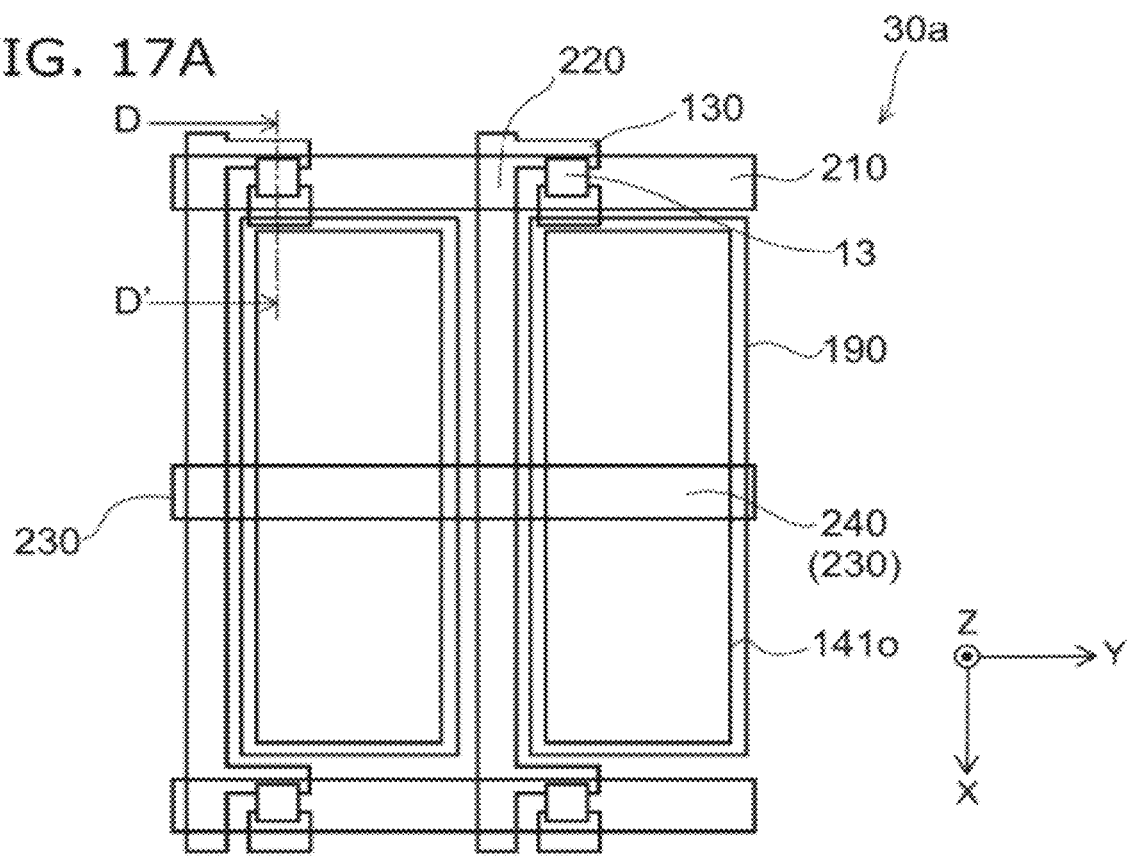
FIGS. 17A and 17B are schematic views illustrating an active matrix display device.
Figure 17B:
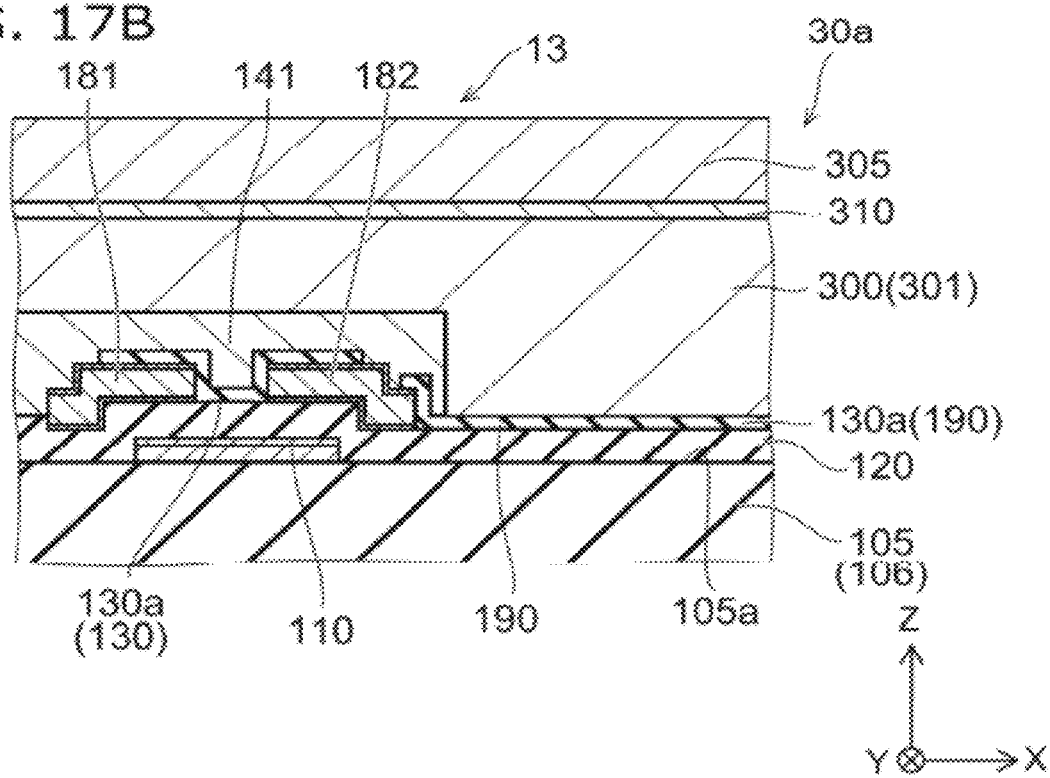

FIGS. 17A and 17B are schematic views illustrating the main configuration of an alternative active matrix display device according to the third embodiment.

More specifically, FIG. 17A is a schematic plan view illustrating the main configuration of the alternative active matrix display device 30a according to the embodiment. FIG. 17B is a sectional view taken along line D-D' of FIG. 17A.

As shown in FIGS. 17A and 17B, the active matrix display device 30a also includes a thin film transistor 13, a scan line 210, a signal line 220, a pixel electrode 190, and an optical element 300 (in this case, a liquid crystal layer 301).

As shown in FIG. 17A, in this thin film transistor 13, on the gate insulating film 120, a source electrode 181 and a drain electrode 182 are provided. Further thereon, an InGaZnO film 130a constituting a semiconductor layer 130 is provided. Further thereon, a channel protection layer 141 is provided. This channel protection layer 141 is made of a silicon oxide film.

Here, in FIG. 17A, the channel protection layer 141 is omitted, and the pixel opening 141o of the channel protection layer 141 is shown by a solid line. The channel protection layer 141 functions also as a passivation film.

Although not shown, on the channel protection layer 141, a passivation film 175 made of e.g. SiN may be further provided. In this case, a pixel opening is provided in the passivation film 175 so that the pixel electrode 190 is exposed.

The thin film transistor 13 also has high mobility because the semiconductor layer 130 includes fine crystallites 133 dispersed three-dimensionally in the semiconductor layer 130 and having periodicity in the arrangement of atoms.

Thus, the active matrix display device 30a has high current driving characteristics and can realize high display performance.

In the following, an example method for manufacturing the thin film transistor 13 and the active matrix display device 30a thus configured is described.

FIGS. 18A to 18E are sequential schematic sectional views illustrating a method for manufacturing a thin film transistor and an active matrix display device according to the third embodiment.

In these figures, the left portion corresponds to the TFT region TFR, the right portion corresponds to the connecting portion region CPR, and the central portion corresponds to a pixel region PPR where the pixel electrode 190 is formed.

First, as shown in FIG. 18A, similarly to the method described with reference to FIG. 2A, on the major surface 105a of a substrate 105, an Al film 110a and a Mo film 110b constituting a gate electrode 110 are formed and processed into a prescribed pattern shape. Also in the connecting portion region CPR, an Al film 110a and a Mo film 110b constituting part of a connecting portion 115 are processed into a prescribed pattern shape.

Next, as shown in FIG. 18B, similarly to that described with reference to FIG. 2B, a $SiO_2$ film 120a constituting a gate insulating film 120 is formed. The film formation temperature at this time is preferably e.g. 300° C. or more.

Next, as shown in FIG. 18C, further on the $SiO_2$ film 120a, a Mo film 161, an Al film 162, and a Mo film 163 constituting a signal line 220, and a source electrode 181 and a drain electrode 182 are formed by the sputtering method to a thickness of e.g. 30 nm, 200 nm, and 50 nm, respectively, and processed into a prescribed pattern shape with a mixed acid of phosphoric acid, acetic acid, and nitric acid.

Next, as shown in FIG. 18D, an InGaZnO film 130a constituting a semiconductor layer 130 and a pixel electrode 190 is formed to a thickness of e.g. 30 nm by e.g. the reactive DC sputtering method. At this time, the composition ratio of the target used is e.g. 1:1:1 in terms of atomic ratio of In:Ga:Zn.

Here, from the experimental results on the relationship between the thickness of the InGaZnO film 130a (semiconductor layer 130) and the characteristics of TFT, the thickness of the InGaZnO film 130a is preferably 10-30 nm.

To avoid step discontinuity of the InGaZnO film 130a at the edge of the source electrode 181 and the drain electrode 182, the above processing of the Mo film 161, the Al film 162, and the Mo film 163 is based on tapered etching so that the edge portion of the source electrode 181 and the drain electrode 182 is beveled.

Then, by photolithography and etching, the InGaZnO film 130a is processed into an island pattern shape of the semiconductor layer 130 and the pixel electrode 190. Here, as the etchant, dilute oxalic acid can be used.

Next, as shown in FIG. 18E, a $SiO_2$ film 141a constituting a channel protection layer 141 is formed by the PE-CVD method with $SiH_4$ and $N_2O$ to a thickness of e.g. 200 nm. At this time, the temperature of the substrate 105 during the film formation of the $SiO_2$ film 141a is set to 270° C. The temperature of the substrate 105 is increased in $N_2O$ plasma of the film formation chamber, and $SiH_4$ gas is gradually supplied into the $N_2O$ plasma. In the early phase of the film formation of the $SiO_2$ film 141a, the gas flow rate ratio of $SiH_4/N_2O$ is set to 1/100 or less. Thus, oxygen is sufficiently supplied in the lower portion of the $SiO_2$ film 141a in contact with the InGaZnO film 130a. This can suppress desorption of oxygen from the surface of the InGaZnO film 130a and achieve good characteristics.

Next, in an annealing furnace with an ambient atmosphere, an annealing treatment for holding the workpiece for one hour is performed at an annealing temperature Ta of e.g. 340° C. to promote crystallization of the InGaZnO film 130a in the amorphous state. Thus, fine crystallites 133 are formed in the semiconductor layer 130.

In this example, annealing is performed in the state in which the InGaZnO film 130a is in contact with the source electrode 181 and the drain electrode 182. Hence, the annealing temperature is set to a lower temperature such that fine crystallites 133 can be formed. In the case where the materials used for the source electrode 181 and the drain electrode 182 are Ti, Al, and Ti, Ti is likely to strip oxygen from the InGaZnO film 130a. Hence, the materials used for the source electrode 181 and the drain electrode 182 are preferably in the configuration of Mo, Al, and Mo.

As necessary, to prevent entry of moisture and the like, a SiN film may be formed as a passivation film to a thickness of e.g. 50 nm by e.g. PE-CVD. In this case, an appropriate substrate temperature is about 260° C.

Next, for electrode extraction, the $SiO_2$ film 141a in the portion corresponding to the connecting portion 115 and the $SiO_2$ film 141a in the portion above the pixel electrode 190 are removed.

The electrical resistance of the InGaZnO film 130a exposed by the removal of the $SiO_2$ film 141a is very high, such as a sheet resistance of 1 MΩ/square or more. However, this resistance can be decreased by e.g. a treatment with a reducing plasma such as hydrogen plasma. For instance, the sheet resistance can be decreased to 10 kΩ/square or less.

Next, to remove device damage during the process, for instance, a damage removal treatment for approximately one hour at a temperature of 260° C. is performed in a nitrogen atmosphere. Thus, the thin film transistor 13 and the active matrix substrate 106 illustrated in FIGS. 17A and 17B can be formed.

Next, the active matrix substrate 106 and an opposed substrate 305 including e.g. a color filter are placed facing each other. A liquid crystal layer 301 is placed therebetween by the dropping method or the injection method. As necessary, a polarizing plate and a phase difference plate are placed. Furthermore, a prescribed driving circuit is connected. As necessary, a back light is placed. Thus, the active matrix display device 30a illustrated in FIGS. 17A and 17B can be fabricated.

FIGS. 19A and 19B are schematic views illustrating the main configuration of an alternative active matrix display device according to the third embodiment.

More specifically, FIG. 19A is a schematic plan view illustrating the configuration of a red pixel of the alternative active matrix display device 30b according to the embodiment. FIG. 19B is a sectional view taken along line E-E' of FIG. 19A.

As shown in FIGS. 19A and 19B, in the alternative active matrix display device 30b according to the embodiment, a colored layer 330 is provided on the thin film transistor 10. In the following description, a green colored layer, a blue colored layer, and a red colored layer are used as the colored layer 330. However, the embodiment is not limited thereto. For instance, cyan, magenta, and yellow colored layers may be used as the colored layer 330.

In this example, on the active matrix substrate 106 (substrate 105), a plurality of thin film transistors 10 are arranged in a matrix configuration. A green colored layer 330G is provided thereon. A red colored layer 330R is provided in a portion corresponding to a red pixel electrode 190, and the pixel electrode 190 is provided thereon. The pixel electrode 190 is electrically connected to the drain electrode 182 through a contact hole 190h provided in the red colored layer 330R. Here, each of the green and blue pixel electrodes 190 is provided with a colored layer 330 corresponding to the associated color.

Figure 20A:
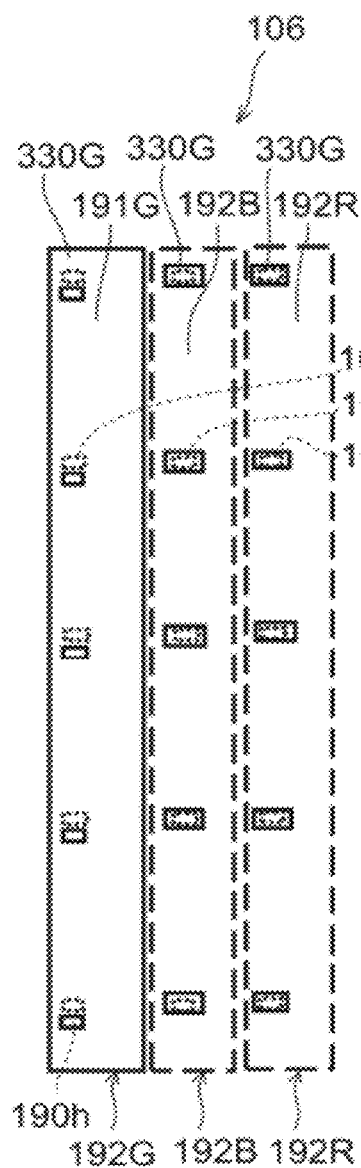
FIGS. 20A to 20C are schematic plan views illustrating the color filter layers.
Figure 20B:
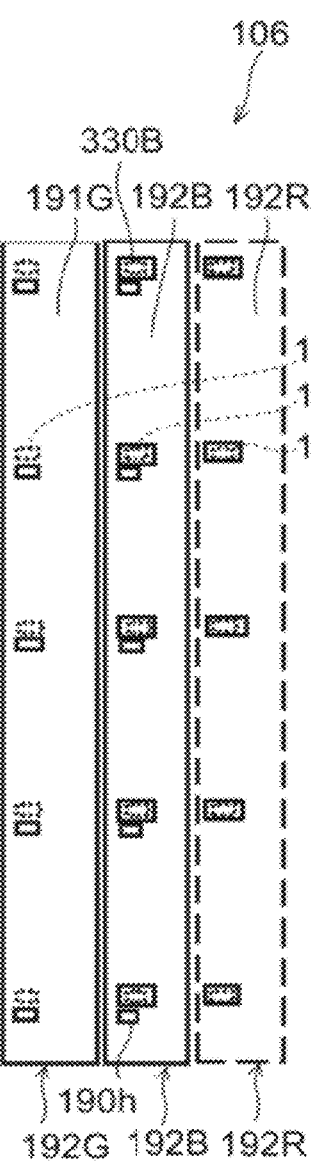
Figure 20C:
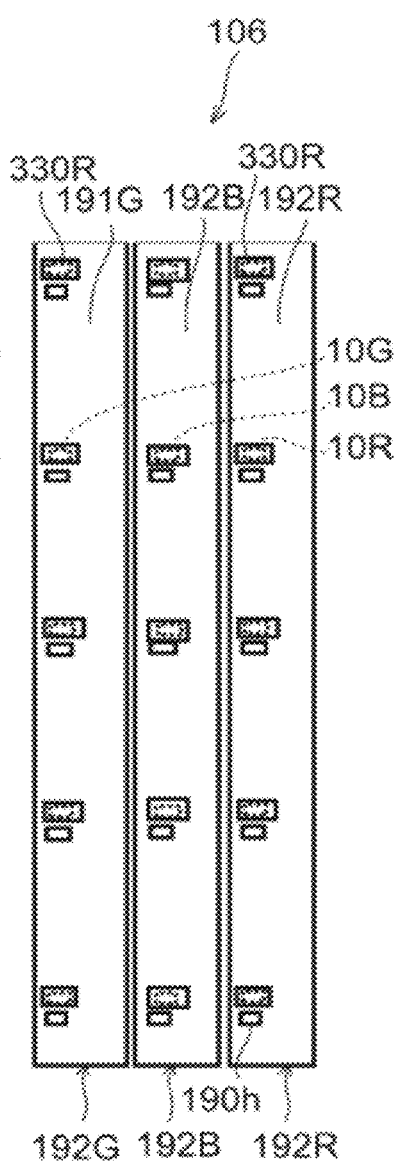

FIGS. 20A to 20C are schematic plan views illustrating the configuration of the colored layers of the alternative active matrix display device according to the third embodiment.

More specifically, these figures illustrate the state of the colored layers 330 in each step in the case where a green colored layer 330G, a blue colored layer 330B, and a red colored layer 330R are formed in this order as the colored layer 330. FIG. 20A corresponds to the state after forming the green colored layer 330G. FIG. 20B corresponds to the state after forming the blue colored layer 330B. FIG. 20C corresponds to the state after forming the red colored layer 330R.

As shown in FIGS. 20A to 20C, the active matrix substrate 106 is provided with a green pixel array 192G, a blue pixel array 192B, and a red pixel array 192R. In this example, these pixel arrays are arrayed in a strip-shaped configuration. However, the embodiment is not limited thereto. The configuration of the pixel array is arbitrary.

The green pixel array 192G, the blue pixel array 192B, and the red pixel array 192R are provided with a green pixel 191G, a blue pixel 191B, and a red pixel 191R, respectively.

As shown in FIG. 20A, the green colored layer 330G is formed in a portion corresponding to the green pixel 191G and on the thin film transistors 10 of the pixels of all the colors (green pixel thin film transistor 10G, blue pixel thin film transistor 10B, and red pixel thin film transistor 10R).

As shown in FIG. 20B, the blue colored layer 330B is provided in a portion corresponding to the blue pixel 191B and on the blue pixel thin film transistor 10B.

As shown in FIG. 20C, the red colored layer 330R is provided in a portion corresponding to the red pixel 191R and on the green pixel thin film transistor 10G and the red pixel thin film transistor 10R.

In each of the green colored layer 330G, the blue colored layer 330B, and the red colored layer 330R, a contact hole 190h for connection between the pixel electrode 190 and the drain electrode 182 is provided.

Thus, in this example, among the three colored layers, the green colored layer 330G having the lowest transmittance for light around 400 nm is stacked on the thin film transistor 10. This can shield the incidence of light having a wavelength around 400 nm on the semiconductor layer 130 of the thin film transistor 10. Thus, while irradiating the active matrix substrate 106 with light having a wavelength around 400 nm, the characteristics degradation in the operation of the thin film transistor 10 is further improved.

In the foregoing example, a stacked film of the green colored layer 330G and the red colored layer 330R is formed on the thin film transistor 10. However, the embodiment is not limited thereto as long as a colored layer having the lowest transmittance for light around 400 nm is formed on the thin film transistor 10. In the case of using a stacked structure for the colored layer 330 (light shielding layer) provided on the thin film transistor, the thickness of the colored layer 330 on the thin film transistor is preferably made as uniform as possible among the pixels to match the spacing between the opposed substrate 305 and the active matrix substrate 106 provided with the thin film transistor. For instance, three layers of the green colored layer 330G, the blue colored layer 330B, and the red colored layer 330R may be stacked on the green pixel thin film transistor 10G, the blue pixel thin film transistor 10B, and the red pixel thin film transistor 10R. This further improves the light shielding capability.

The order of forming the green colored layer 330G, the blue colored layer 330B, and the red colored layer 330R is arbitrary.

The green colored layer 330G, the blue colored layer 330B, and the red colored layer 330R may be made of a colored resist having a corresponding color. Alternatively, a resin layer having a corresponding color may be provided and processed into a prescribed pattern shape by using another resist. Furthermore, as a light shielding layer provided on the thin film transistor, a black resist may be used.

Fourth Embodiment

The active matrix display device according to a fourth embodiment is an active matrix organic EL (electroluminescence) display device based on one of the thin film transistors according to the embodiments described above.

Figure 21A:
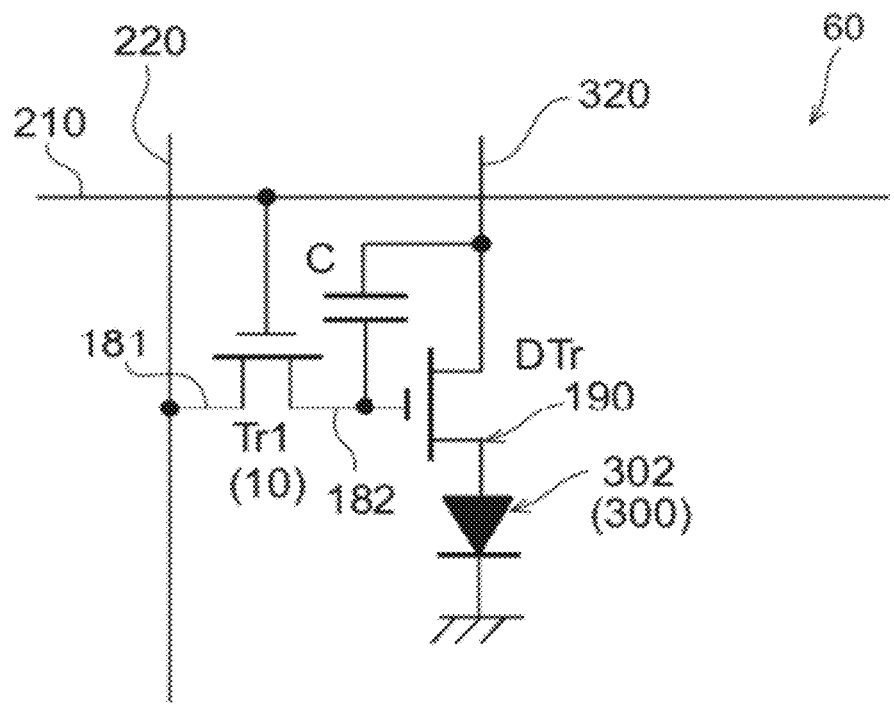
FIGS. 21A and 21B are circuit diagrams illustrating equivalent circuits of the active matrix display devices.
Figure 21B:
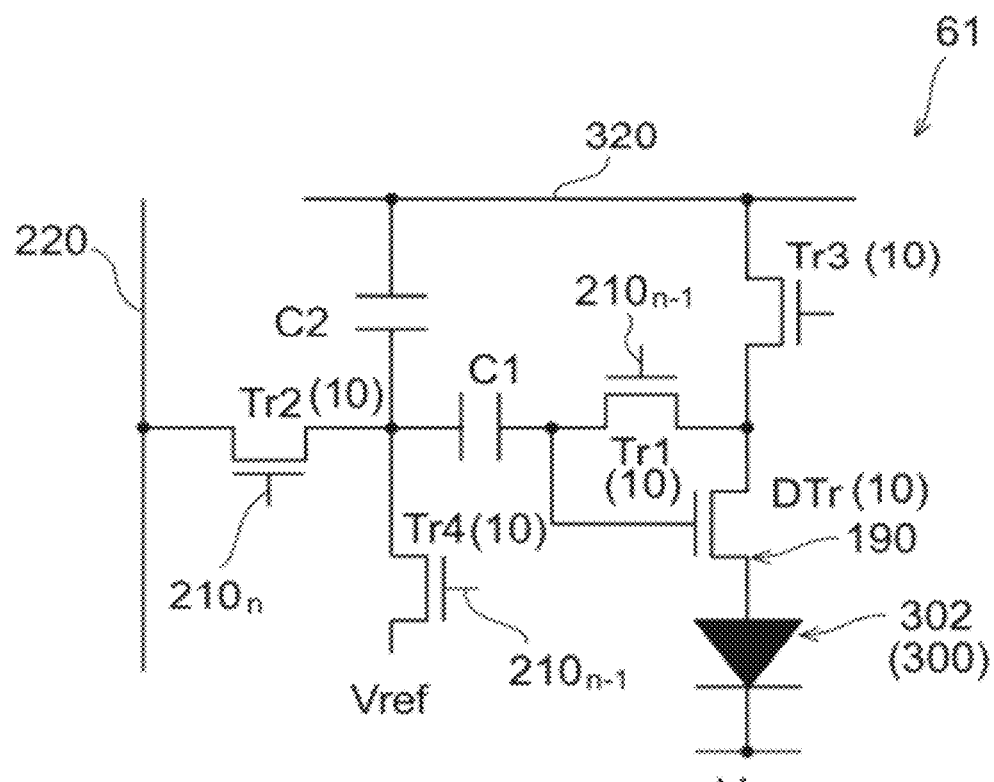

FIGS. 21A and 21B are circuit diagrams illustrating equivalent circuits of the active matrix display devices according to the fourth embodiment.

FIGS. 21A and 21B show example equivalent circuits of two kinds of active matrix display devices 60 and 61 based on organic EL.

As shown in FIG. 21A, the active matrix display device 60 according to the embodiment includes a first transistor Tr1 for pixel selection, and a pixel driving transistor DTr connected to a power supply line 320 and driving an organic EL layer 302. For these first transistor Tr1 and pixel driving transistor DTr, the thin film transistor according to the above embodiments can be used.

As shown in FIG. 21B, the alternative active matrix display device 61 according to the embodiment includes first to fourth transistors Tr1-Tr4 for pixel selection, and a pixel driving transistor DTr. The gate of the second transistor Tr2 is connected to the n-th scan line $210_n$. The gates of the first transistor Tr1 and the fourth transistor Tr4 are connected to the (n-1)-th scan line $210_{n-1}$. For these first to fourth transistors Tr1-Tr4 and pixel driving transistor DTr, any thin film transistor according to the above embodiments can be used.

These active matrix display devices 60 and 61 also include a plurality of thin film transistors 10 arranged in a matrix configuration, a scan line 210 connected to the gate electrode 110 of each thin film transistor 10, a signal line 220 connected to the source electrode 181 of each thin film transistor 10, a pixel electrode 190 connected to the drain electrode 182 of each thin film transistor 10, and an optical element 300 (in this case, an organic EL layer 302) changing its optical characteristics in response to an electrical signal applied to the pixel electrode 190.

These active matrix display devices 60 and 61 are based on the thin film transistor according to the embodiments. Hence, high mobility can be realized. Thus, an active matrix display device with high display performance, high reliability, and high productivity can be provided.

Fifth Embodiment

The method for manufacturing a thin film transistor according to a fifth embodiment is a method for manufacturing a thin film transistor including a gate electrode 110, a semiconductor layer 130 provided facing the gate electrode 110 and including an oxide including at least one of gallium and zinc, and indium, a gate insulating film 120 provided between the gate electrode 110 and the semiconductor layer 130, and a source electrode 181 and a drain electrode 182 electrically connected to the semiconductor layer 130 and spaced from each other. The semiconductor layer 130 includes a plurality of fine crystallites 133 dispersed three-dimensionally and having periodicity in the arrangement of atoms.

Figure 22:
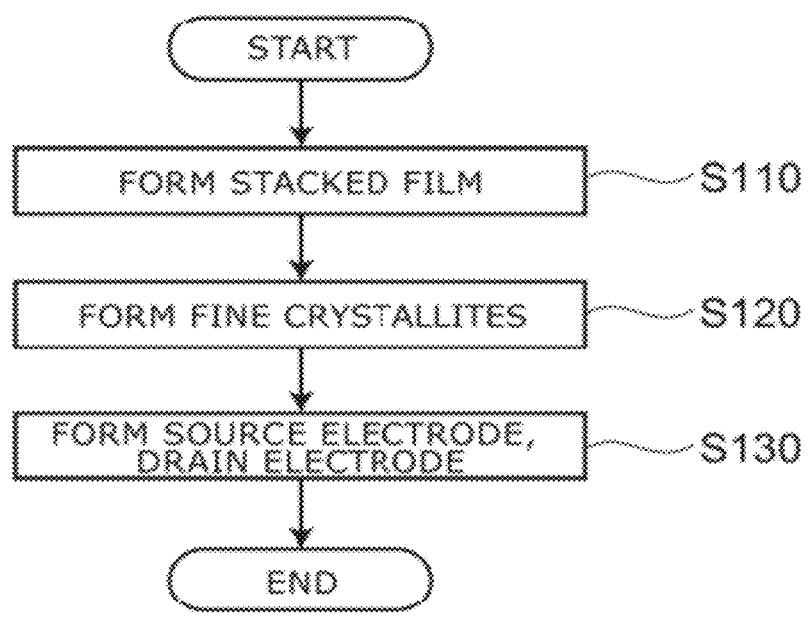
FIG. 22 is a flow chart illustrating the method for manufacturing a thin film transistor.

FIG. 22 is a flow chart illustrating the method for manufacturing a thin film transistor according to the fifth embodiment.

As shown in FIG. 22, the method for manufacturing a thin film transistor according to the embodiment includes a step for forming a stacked film of a gate electrode 110, a gate insulating film 120, and an oxide film (InGaZnO film 130a) including at least one of gallium and zinc, and indium (step S110), a step for forming fine crystallites 133 in the oxide film by heat treatment (annealing treatment) of the stacked film in an oxygen atmosphere at 320° C. or more and 380° C. or less (step S120), and a step for forming a source electrode 181 and a drain electrode 182 so as to be connected to the oxide film (step S130).

The above step for forming a stacked film (step S110) includes either a step for forming an oxide film on the major surface 105a of a substrate 105, forming a gate insulating film 120 made of a silicon oxide film on the oxide film, and forming a gate electrode 110 on the gate insulating film 120 so that the oxide film is covered with the gate insulating film 120 (e.g., the step described with reference to FIGS. 14A and 14B), or a step for forming a gate electrode 110 on the major surface 105a of a substrate 105, forming a gate insulating film 120 on the gate electrode 110, forming an oxide film on the gate insulating film 120, and forming a channel protection layer 140 (or channel protection layer 141) made of a silicon oxide film on the oxide film so that the oxide film is covered with the channel protection layer (e.g., the step described with reference to FIGS. 2A and 2B, or the step described with reference to FIGS. 18A to 18E).

The above step for forming fine crystallites 133 (step S120) is performed in the state in which the oxide film is covered with the silicon oxide film constituting the gate insulating film 120 and the channel protection layer 140 (or channel protection layer 141). That is, as the step S120, for instance, the step described with reference to FIG. 14B, the step described with reference to FIG. 2C, or the step described with reference to FIG. 18E is performed.

Thus, the stacked film is heat treated at 320° C. or more and 380° C. or less in the state in which the oxide film (InGaZnO film 130a) constituting the semiconductor layer 130 is covered with the silicon oxide film constituting the gate insulating film 120 and the channel protection layer 140 (or channel protection layer 141). This can form fine crystallites 133 having a desired size in the oxide film without causing oxygen vacancy in the oxide film. Thus, a high-mobility thin film transistor based on oxide semiconductor can be manufactured.

As described above, after the source electrode 181 and the drain electrode 182 are formed, if heat treatment is performed at a high temperature of 300° C. or more, oxygen may migrate from the InGaZnO film 130a toward the source electrode 181 and the drain electrode 182. This may cause characteristics degradation such as negative shift of the threshold voltage Vth. Thus, the above heat treatment is preferably performed in the state of being not in contact with the source electrode 181 and the drain electrode 182. That is, step S120 is preferably performed before step S130. Thus, a thin film transistor with stabler characteristics can be manufactured.

Furthermore, for instance, the $SiO_2$ film 140a (or $SiO_2$ film 141a) constituting the channel protection layer 140 (or channel protection layer 141) is preferably formed by the PE-CVD method with the substrate temperature being 230° C. or more. If the substrate temperature during the film formation of the $SiO_2$ film 140a constituting the channel protection layer 140 is lower than 230° C., elements resulting from the raw material gas other than silicon and oxygen, such as hydrogen, and possibly carbon, are left in the film. This is likely to cause the insulating film to be chemically and electrically weak. However, by setting the substrate temperature to 230° C. or more, a chemically and electrically strong insulating film can be realized.

If a large amount of hydrogen is left in the $SiO_2$ film 140a, then by the subsequent annealing step, hydrogen diffuses into the InGaZnO film 130a and decreases the resistance of the channel layer. Furthermore, in the $SiO_2$ film containing a large amount of hydrogen in the film, the hydrogen site serves as a charge trap. This varies the electric field of the back channel of the thin film transistor and causes the reliability degradation of the thin film transistor.

As the film formation method, the PE-CVD method rather than the sputtering method is adopted. Thus, a $SiO_2$ film 140a having good coverage and uniform structure can be formed. This can improve the gas barrier performance.

According to the embodiments, a high-mobility thin film transistor based on oxide semiconductor and a method for manufacturing the same are provided.

The embodiments of the invention have been described above with reference to examples. However, the invention is not limited to these examples. For instance, any specific configurations of various components such as the substrate, gate electrode, gate insulating film, semiconductor layer, source electrode, drain electrode, channel protection layer, passivation film, and colored layer constituting the thin film transistor are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the thin film transistor described above in the embodiments of the invention. All the thin film transistors thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A method for manufacturing a thin film transistor including:
   a gate electrode;
   a semiconductor layer provided facing the gate electrode, including an oxide including at least one of gallium and zinc, and indium, and including a plurality of fine crys- tallites dispersed three-dimensionally and having periodicity in arrangement of atoms;
a gate insulating film provided between the gate electrode and the semiconductor layer; and
a source electrode and a drain electrode electrically connected to the semiconductor layer and spaced from each other,
the method comprising:
forming the gate electrode on a major surface of a substrate, forming the gate insulating film made of a silicon oxide film on the gate electrode, forming an oxide film including indium and at least one of gallium and zinc on the gate insulating film, and forming a channel protection layer made of a silicon oxide film on the oxide film so that the oxide film is covered with the channel protection layer to form a stacked film of the gate electrode, the gate insulating film, the oxide film, and the channel protection layer;
forming the fine crystallites in the oxide film by heat treatment of the stacked film at 320° C. or more and 380° C. or less in a furnace; and
forming the source electrode and the drain electrode so as to be connected to the oxide film, the forming the source electrode and the drain electrode being performed after the forming the fine crystallites,
the forming the fine crystallites being performed in a state in which a lower surface of the oxide film is covered with the gate insulating film and an upper surface of the oxide film is covered with the channel protection layer,
wherein the fine crystallites are dispersed uniformly in the oxide film,
wherein a particle diameter of the fine crystallites is 5 nanometers or less,
wherein the oxide film does not include crystallites having a diameter larger than 5 nanometers,
wherein the semiconductor layer includes a first region overlapping the gate electrode in a direction perpendicular to the major surface, a second region overlapping the source electrode in the direction, and a third region overlapping the drain electrode in the direction,
wherein an average particle diameter of the fine crystallites having the particle diameter of 2 nanometers or more among the plurality of fine crystallites is 3.5 nanometers or less in each of the first, second, and third regions, and
wherein oxygen concentrations in the first, second, and third regions are same.

2. The method according to claim 1, wherein the forming the fine crystallites is performed in a nitrogen atmosphere.

3. The method according to claim 1, wherein the forming the gate insulating film includes performing at least one of a chemical mechanical polishing processing, an RIE processing, and an argon sputtering processing to flatten a surface of the gate insulating film.

4. A method for manufacturing a thin film transistor including:
a gate electrode;
a semiconductor layer provided facing the gate electrode, including an oxide including at least one of gallium and zinc, and indium, and including a plurality of fine crystallites dispersed three-dimensionally and having periodicity in arrangement of atoms;
a gate insulating film provided between the gate electrode and the semiconductor layer; and
a source electrode and a drain electrode electrically connected to the semiconductor layer and spaced from each other,
the method comprising:
forming an oxide film including indium and at least one of gallium and zinc on a major surface of a substrate, forming the gate insulating film made of a silicon oxide film on the oxide film so that the oxide film is covered with the gate insulating film, forming the gate electrode on the gate insulating film to form a stacked film of the oxide film, the gate insulating film, and the gate electrode;
forming the fine crystallites in the oxide film by heat treatment of the stacked film at 320° C. or more and 380° C. or less in a furnace; and
forming the source electrode and the drain electrode so as to be connected to the oxide film,
the forming the fine crystallites being performed in a state in which the oxide film is covered with the gate insulating film,
wherein the fine crystallites are dispersed uniformly in the oxide film,
wherein a particle diameter of the fine crystallites is 5 nanometers or less,
wherein the oxide film does not include crystallites having a diameter larger than 5 nanometers,
wherein the semiconductor layer includes a first region overlapping the gate electrode in a direction perpendicular to the major surface, a second region overlapping the source electrode in the direction, and a third region overlapping the drain electrode in the direction,
wherein an average particle diameter of the fine crystallites having the particle diameter of 2 nanometers or more among the plurality of fine crystallites is 3.5 nanometers or less in each of the first, second, and third regions, and
wherein oxygen concentrations in the first, second, and third regions are same.

5. The method according to claim 4, wherein the forming the fine crystallites is performed in a nitrogen atmosphere.

6. The method according to claim 4, further comprising flattening the major surface of the substrate before forming the oxide film.

7. A method for manufacturing a display including:
a thin film transistors including:
a gate electrode;
a semiconductor layer provided facing the gate electrode, including an oxide including at least one of gallium and zinc, and indium, and including a plurality of fine crystallites dispersed three-dimensionally and having periodicity in arrangement of atoms;
a gate insulating film provided between the gate electrode and the semiconductor layer; and
a source electrode and a drain electrode electrically connected to the semiconductor layer and spaced from each other;
a pixel electrode connected to one of the drain electrode and the source electrode; and
an optical element producing at least one of a change in optical characteristics and light emitting in response to an electrical signal applied to the pixel electrode;
the method comprising:
forming the gate electrode on a major surface of a substrate, forming the gate insulating film made of a silicon oxide film on the gate electrode, forming an oxide film including indium and at least one of gallium and zinc on the gate insulating film, and forming a channel protection layer made of a silicon oxide film on the oxide film so that the oxide film is covered with the channel protection layer to form a stacked film of the gate electrode, the gate insulating film, the oxide film and the channel protection layer;

forming the fine crystallites in the oxide film by heat treatment of the stacked film at 320° C. or more and 380° C. or less in a furnace; and forming the source electrode and the drain electrode so as to be connected to the oxide film, the forming the source electrode and the drain electrode being performed after the forming the fine crystallites, the forming the fine crystallites being performed in a state in which a lower surface of the oxide film is covered with the gate insulating film and an upper surface of the oxide film is covered with the channel protection layer, wherein the fine crystallites are dispersed uniformly in the oxide film, wherein a particle diameter of the fine crystallites is 5 nanometers or less, wherein the oxide film does not include crystallites having a diameter larger than 5 nanometers, wherein the semiconductor layer includes a first region overlapping the gate electrode in a direction perpendicular to the major surface, a second region overlapping the source electrode in the direction, and a third region overlapping the drain electrode in the direction, wherein an average particle diameter of the fine crystallites having the particle diameter of 2 nanometers or more among the plurality of fine crystallites is 3.5 nanometers or less in each of the first, second, and third regions, and wherein oxygen concentrations in the first, second, and third regions are same.

8. The method according to claim 7, wherein the forming the fine crystallites is performed in a nitrogen atmosphere.

9. The method according to claim 7, wherein the forming the gate insulating film includes performing at least one of a chemical mechanical polishing processing, an RIE processing, and an argon sputtering processing to flatten a surface of the gate insulating film.

10. A method for manufacturing a display including:
a thin film transistors including:
a gate electrode;
a semiconductor layer provided facing the gate electrode, including an oxide including at least one of gallium and zinc, and indium, and including a plurality of fine crystallites dispersed three-dimensionally and having periodicity in arrangement of atoms;
a gate insulating film provided between the gate electrode and the semiconductor layer; and
a source electrode and a drain electrode electrically connected to the semiconductor layer and spaced from each other;
a pixel electrode connected to one of the drain electrode and the source electrode; and
an optical element producing at least one of a change in optical characteristics and light emitting in response to an electrical signal applied to the pixel electrode;
the method comprising:
forming an oxide film including indium and at least one of gallium and zinc on a major surface of a substrate, forming the gate insulating film made of a silicon oxide film on the oxide film so that the oxide film is covered with the gate insulating film, forming the gate electrode on the gate insulating film to form a stacked film of the oxide film, the gate insulating film and the gate electrode;

forming the fine crystallites in the oxide film by heat treatment of the stacked film at 320° C. or more and 380° C. or less in a furnace; and forming the source electrode and the drain electrode so as to be connected to the oxide film, the forming the source electrode and the drain electrode being performed after the forming the fine crystallites, the forming the fine crystallites being performed in a state in which the oxide film is covered with the gate insulating film, wherein the fine crystallites are dispersed uniformly in the oxide film, wherein a particle diameter of the fine crystallites is 5 nanometers or less, wherein the oxide film does not include crystallites having a diameter larger than 5 nanometers, wherein the semiconductor layer includes a first region overlapping the gate electrode in a direction perpendicular to the major surface, a second region overlapping the source electrode in the direction, and a third region overlapping the drain electrode in the direction, wherein an average particle diameter of the fine crystallites having the particle diameter of 2 nanometers or more among the plurality of fine crystallites is 3.5 nanometers or less in each of the first, second, and third regions, and wherein oxygen concentrations in the first, second, and third regions are same.

11. The method according to claim 10, wherein the forming the fine crystallites is performed in a nitrogen atmosphere.

12. The method according to claim 10, further comprising flattening the major surface of the substrate before forming the oxide film.

13. The method according to claim 1, wherein the forming the oxide film is performed in an atmosphere including oxygen and argon, and an argon concentration in the atmosphere is higher than an oxygen concentration in the atmosphere.

14. The method according to claim 13, wherein the forming the oxide film is performed by a sputtering method.

15. The method according to claim 7, wherein the forming the oxide film is performed in an atmosphere including oxygen and argon, and an argon concentration in the atmosphere is higher than an oxygen concentration in the atmosphere.

16. The method according to claim 15, wherein the forming the oxide film is performed by a sputtering method.

17. The method according to claim 10, wherein the forming the oxide film is performed in an atmosphere including oxygen and argon, and an argon concentration in the atmosphere is higher than an oxygen concentration in the atmosphere.

18. The method according to claim 17, wherein the forming the oxide film is performed by a sputtering method.

19. The method according to claim 4, wherein the forming the oxide film is performed in an atmosphere including oxygen and argon, and an argon concentration in the atmosphere is higher than an oxygen concentration in the atmosphere.

20. The method according to claim 13, wherein a proportion of oxygen is not more than 5% relative to argon.

21. The method according to claim 15, wherein a proportion of oxygen is not more than 5% relative to argon.

22. The method according to claim 17, wherein a proportion of oxygen is not more than 5% relative to argon.

23. The method according to claim 19, wherein a proportion of oxygen is not more than 5% relative to argon.

* * * * *